United States Patent
Swenson

(10) Patent No.: US 7,067,828 B2
(45) Date of Patent: Jun. 27, 2006

(54) METHOD OF AND APPARATUS FOR MEASUREMENT AND CONTROL OF A GAS CLUSTER ION BEAM

(75) Inventor: David R. Swenson, Georgetown, MA (US)

(73) Assignee: Epion Corporation, Billerica, MA (US)

(*) Notice: Subject to any disclaimer, the term of this patent is extended or adjusted under 35 U.S.C. 154(b) by 0 days.

(21) Appl. No.: 10/765,246

(22) Filed: Jan. 27, 2004

(65) Prior Publication Data

US 2004/0222389 A1   Nov. 11, 2004

Related U.S. Application Data

(60) Provisional application No. 60/442,854, filed on Jan. 27, 2003.

(51) Int. Cl.
   *H01J 37/317* (2006.01)
(52) U.S. Cl. .............. 250/492.21; 250/287; 250/282; 438/515; 427/450
(58) Field of Classification Search ........... 250/492.21, 250/287, 282; 438/515; 427/450
   See application file for complete search history.

(56) References Cited

U.S. PATENT DOCUMENTS

| | | | | |
|---|---|---|---|---|
| 4,559,096 | A | | 12/1985 | Friedman et al. ........ 156/272.2 |
| 5,153,430 | A | * | 10/1992 | Gammel et al. ............ 250/251 |
| 5,644,220 | A | | 7/1997 | Urs et al. ................... 324/71.3 |
| 5,814,194 | A | | 9/1998 | Deguchi et al. ......... 204/192.1 |
| 6,060,718 | A | | 5/2000 | Brailove et al. ......... 250/505.1 |
| 6,770,874 | B1 | * | 8/2004 | Dykstra ...................... 250/287 |
| 6,831,272 | B1 | * | 12/2004 | Mack et al. ................ 250/287 |
| 2001/0054686 | A1 | | 12/2001 | Torti et al. ................... 250/288 |
| 2002/0036261 | A1 | | 3/2002 | Dykstra ...................... 250/287 |
| 2002/0070361 | A1 | | 6/2002 | Mack et al. .............. 250/505.1 |

OTHER PUBLICATIONS

Toyoda, N. et al. "Surface Processing by Gas Cluster Ion Beams." Ion Implant Technology, IEEE, Proceedings of the 11th International Conference on, Jun. 16-21, 1996. pp. 808-811.

Mack, M.E. "Design Issues in Gas Cluster Ion Beamlines." Ion Implant Technology, IEEE, Proceedings of the 14th International Conference on, Sep. 22-27, 2002. pp. 665-668.

\* cited by examiner

*Primary Examiner*—Nikita Wells
*Assistant Examiner*—Zia R. Hashmi
(74) *Attorney, Agent, or Firm*—Jerry Cohen; John A. Hamilton

(57) ABSTRACT

Methods and apparatus are disclosed for measuring controlling characteristics of clusters in a cluster ion beam, including average cluster ion velocity $\bar{v}$, average cluster ion mass $\bar{m}$, average cluster ion energy $\bar{E}$, average cluster ion charge state $\bar{q}$, average cluster ion mass per charge $$\left(\frac{m}{q}\right)_{average},$$

and average energy/charge $$\left(\frac{E}{q}\right)_{average}.$$

The measurements are employed in gas cluster ion beam processing systems to monitor and control gas cluster ion beam characteristics that are critical for optimal processing of workpieces by gas cluster ion beam irradiation.

34 Claims, 12 Drawing Sheets

METHOD OF AND APPARATUS FOR MEASUREMENT AND CONTROL OF A GAS CLUSTER ION BEAM

CROSS REFERENCE TO RELATED PATENT APPLICATIONS

This application claims priority of U.S. Provisional Application Ser. No. 60/442,854 entitled "Method And Apparatus For Measurement And Control Of A Gas Cluster Ion Beam", filed Jan. 27, 2003, the contents of which are incorporated herein by reference.

BACKGROUND OF THE INVENTION

The present invention relates generally to the measurement and control of characteristics of a cluster ion beam and, more particularly, to measuring and/or controlling the average charge state, average cluster ion mass, and/or average cluster ion energy of cluster ions in a gas cluster ion beam.

The use of a cluster ion beam for processing surfaces is known (see for example, U.S. Pat. No. 5,814,194, Deguchi et al., incorporated herein by reference) in the art. For purposes of this discussion, gas clusters are nano-sized aggregates of materials that are gaseous under conditions of standard temperature and pressure. Such gas clusters typically are comprised of aggregates of from a few to several thousand molecules loosely bound to form the cluster. The clusters can be ionized by electron bombardment or other means, permitting them to be formed into directed beams of controllable energy. Such ions each typically carry positive charges of $q \cdot e$ (where e is the electronic charge and q is an integer of from one to several representing the charge state of the cluster ion). Non-ionized clusters may also exist within a cluster ion beam. The larger sized cluster ions are often the most useful because of their ability to carry substantial energy per cluster ion, while yet having only modest energy per molecule. The clusters disintegrate on impact, with each individual molecule carrying only a small fraction of the total cluster ion energy. Consequently, the impact effects of large cluster ions are substantial, but are limited to a very shallow surface region. This makes cluster ions effective for a variety of surface modification processes, without the tendency to produce deeper subsurface damage characteristic of conventional monomer ion beam processing.

Means for creation of and acceleration of such gas cluster ion beams (GCIBs) are described in the reference (U.S. Pat. No. 5,814,194) previously cited. Presently available cluster ion sources produce clusters ions having a wide distribution of sizes, N (where N=the number of molecules in each cluster ion—in the case of monatomic gases like argon, an atom of the monatomic gas will be referred to as a molecule and an ionized atom of such a monatomic gas will be referred to as a molecular ion—or simply a monomer ion—throughout this discussion).

Many useful surface processing effects can be achieved by bombarding surfaces with GCIBs. These processing effects include, but are not necessarily limited to, cleaning, smoothing, etching, and film growth. There is need for improved diagnostic measurements to predict and control the gas cluster ion beam physics that affect processing rates of surfaces and hence permit these rates to be optimized. The fundamentals of GCIB-surface interactions are individual cluster ions impacting a surface, moving and ejecting material by direct sputtering and/or through melting and evaporation, creating nano-scale craters of various depths and diameters. GCIB craters can be on the on the scale of tens to hundreds of Angstroms, and depend on cluster ion mass and velocity. The nature of the craters formed (and thus the surface processing characteristics) by a GCIB depends on the mass of the cluster ions and their impact velocity.

Cluster ion velocity may be measured using time-of-flight techniques (as taught in U.S. Patent Application Publications 2002-0036261A1, Dykstra, Jerald P., and 2002-0070361A1, Mack, et al., for example, which are incorporated herein by reference). Also, by a variety magnetic and electrostatic measurement techniques sensitive to the mass/charge state ratio (m/q), the momentum, energy and mass of ionized clusters can be determined, when using ionization conditions such that the ions are predominantly singly charged, thus assuring that q was known to be approximately one. Additionally, it is known that techniques exist for measuring average mass/charge state ratio, $$\left(\frac{m}{q}\right)_{average},$$

or can be based on existing techniques (as taught in U.S. Patent Application Publication 2001-0054686A1, Torti. et al., for example, incorporated by reference).

In many cases, it is found that in order to achieve industrially practical throughputs in GCIB processing, GCIB currents on the order of hundreds to thousands of microamps are required. Recent efforts to increase the intensity and ionization of GCIBs are producing additional higher charge state clusters (q>1). When ionization is performed by electron bombardment, ionization is produced by random electron impacts. In order to produce a high ratio of ionized to non-ionized clusters, the electron impact probability must be high and the resulting charge state distribution follows approximately Poisson statistics, with the approximate probability, P(q), of charge state q given by:

$$\overline{P}(q) = \frac{\overline{q}^q}{q!} e^{-\overline{q}}, \qquad \text{(Eqn. 1)}$$

where $\overline{q}$ is the average ionized cluster charge state after leaving the ionizer. Thus an ionized cluster beam with a highly ionized fraction will also be a multiply charged beam. For example, theoretically the average cluster charge state of a GCIB beam where 95% of the clusters are ionized would be 3, with more than 8% of the beam in charge states 6 and higher. However, such highly charged clusters can fragment, resulting in a different charge state distribution. The interaction of the cluster ions with residual gas in the vacuum system can also cause charge exchange reactions and cluster ion fragmentation and so in a practical beam, the precise charge state is not readily predicted. The existence of high charge state clusters cannot be determined using present instrumentation such as magnetic spectrometers, electrostatic spectrometers, RF quadrupole mass spectrometers, time-of-flight, retarding potential mass spectrometers, and pressure gauge measurements, all of which measure either m/q or the energy/charge state ratio, E/q. It should be noted that for ionized cluster m/q on the order of 10000 AMU or less, it is possible to resolve different charge state families in the m/q spectra but this is not practical for more massive cluster ions where m/q states cannot be practically resolved or overlap. Other methods have been used to determine these parameters for very-large very-highly-charged (q>1000) molecules produced by electro-spray techniques, and also for the case of highly-charged atoms in the solar wind or electrostatically accelerated dust particles. These techniques are not applicable to GCIBs because, for the former case, the charge states are too low, and with respect to the latter technique, because the cluster ion's collision energy is nearly all deposited thermally and hence cannot be detected using practical known methods. Thus, improved methods and apparatus are needed to measure and control m, q and E of these cluster ions.

It is therefore an object of this invention to provide methods and apparatus for measuring the average charge state $\bar{q}$ of a cluster ion beam.

It is a further object of this invention to provide methods and apparatus for measuring average mass $\bar{m}$ and/or average energy $\bar{E}$ of energetic ionized clusters in a beam.

Another object of this invention is to provide an improved method and apparatus for measuring and controlling the properties of a gas cluster ion beam in a GCIB processing system for improved GCIB processing of a workpiece.

SUMMARY OF THE INVENTION

The objects set forth above as well as further and other objects and advantages of the present invention are achieved by the embodiments of the invention described hereinbelow.

In a first embodiment, the present invention provides a method involving separate measurements of average energy per charge $$\left(\frac{E}{q}\right)_{average},$$

average velocity $\bar{v}$, and average charge state $\bar{q}$ on a sample of cluster ion beam. The average energy per charge is measured using an electrostatic spectrometer, and the velocity is measured using time-of-flight. The average charge state $\bar{q}$ is measured and used in combination with the other measurements to determine averages of m and E for the ionized cluster distribution. The average charge state is calculated by measuring the flow rate of particles (clusters), Γ, using a fast particle counter and by measuring the electrical beam current, I, using a current sensor, preferably a faraday cup, for a small sample of the ion beam. The ratio of electrical current to particle flow (according to Eqn. 2 below) yields the cluster average charge state, $\bar{q}$ measurement. This average charge state measurement is combined with the electrostatic spectrometer measurements of $$\left(\frac{E}{q}\right)_{average}$$

to determine the average cluster ion energy, and with time-of-flight measurements of average velocity, $\bar{v}$, to determine average mass, $\bar{m}$, as described in Eqn. 2, Eqn. 3, and Eqn. 5 below.

In a second embodiment, the present invention provides a method of making measurements of average mass per charge $$\left(\frac{m}{q}\right)_{average},$$

of the beam and of average energy per charge $$\left(\frac{E}{q}\right)_{average},$$

and average charge state $\bar{q}$ on a sample of the cluster ion beam. The average energy per charge is measured using an electrostatic spectrometer, and the average mass per charge is measured using a pressure-charge sensor. The average charge state $\bar{q}$ is measured and used in combination with the other measurements to determine averages of m and E for the ionized cluster distribution. As in the first embodiment, the average charge state is measured by measuring the flow rate of particles (clusters), Γ, using a fast particle counter and by measuring the electrical beam current, I, using a current sensor, preferably a faraday cup for a small sample of the ion beam. The ratio of electrical current to particle flow (according to Eqn. 2) yields the cluster average charge state, $\bar{q}$ measurement. This average charge state measurement is combined with the electrostatic spectrometer measurements of $$\left(\frac{E}{q}\right)_{average}$$

to determine the average cluster ion energy, and with average mass per charge, $$\left(\frac{m}{q}\right)_{average},$$

measurements to determine average mass, $\bar{m}$, as described in Eqn. 2, Eqn. 3, and Eqn. 4 below.

In Eqn. 2, α and β are the detection efficiencies for the current and particle detectors respectively.

$$\bar{q} = \frac{\alpha I}{\beta e \Gamma} \quad \text{(Eqn. 2)}$$

$$\bar{E} = \bar{q}\left(\frac{E}{q}\right)_{average} \quad \text{(Eqn. 3)}$$

$$\bar{m} = \bar{q}\left(\frac{m}{q}\right)_{average} \quad \text{(Eqn. 4)}$$

$$\bar{m} = \frac{2\bar{E}}{\bar{v}^2} \quad \text{(Eqn. 5)}$$

BRIEF DESCRIPTION OF THE DRAWING

For a better understanding of the present invention, together with other and further objects thereof, reference is made to the accompanying figures and detailed description, wherein:

FIG. 3A is a schematic showing a first embodiment of the apparatus for making the beam measurements of the invention, wherein is depicted a case for a non-zero analyzer voltage;

DETAILED DESCRIPTION OF THE PREFERRED EMBODIMENTS

Figure 1:
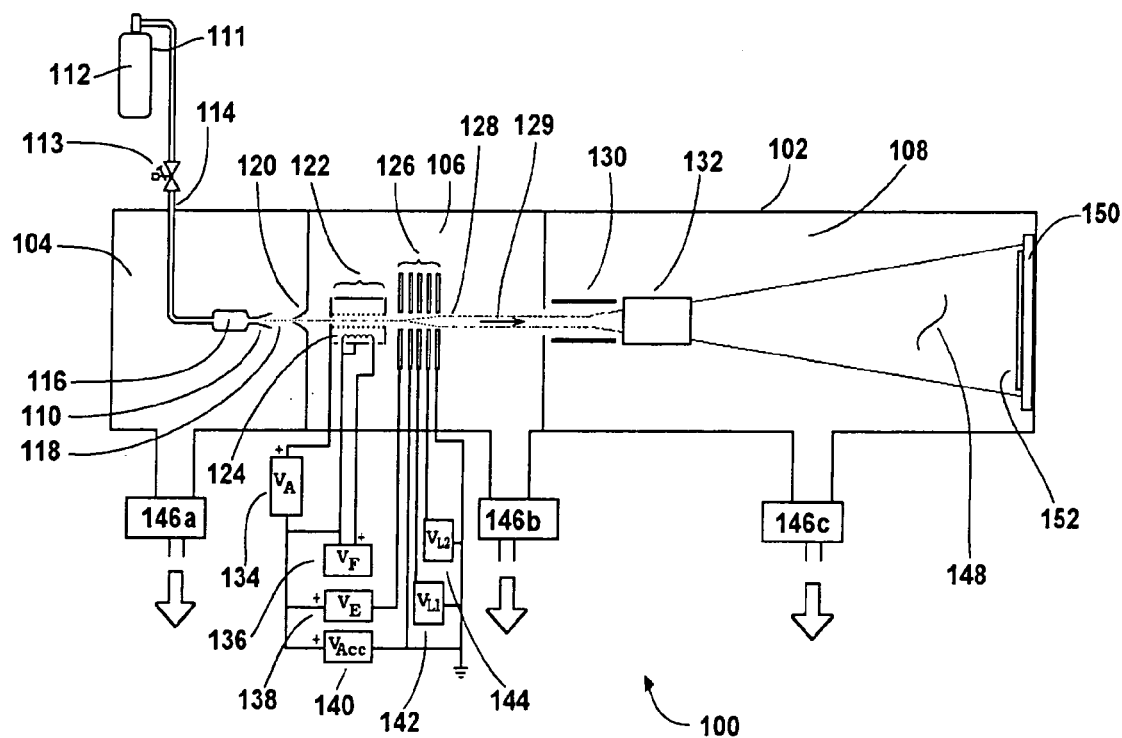
FIG. 1 is a schematic showing the basic elements of a prior art GCIB processing apparatus that uses an electrostatically scanned beam.

FIG. 1 shows a schematic of the basic elements of a typical configuration for a GCIB processor 100, which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128 having a GCIB axis 129. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration energy equal to $V_{Acc}$ electron volts (eV). One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
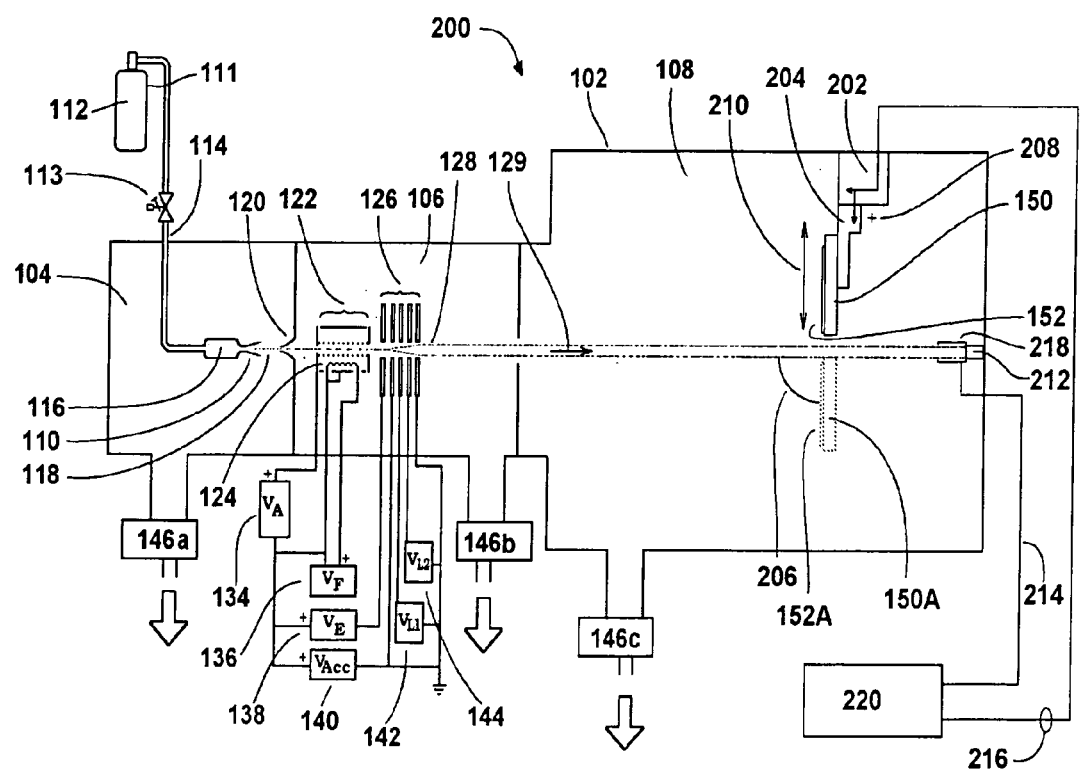
FIG. 2 is a schematic showing the basic elements of a GCIB processing apparatus that uses a stationary beam with mechanical scanning of the workpiece.

FIG. 2 shows a schematic of the basic elements of a prior art mechanically scanning GCIB processing apparatus 200 having a stationary beam with a mechanically scanned workpiece 152, and having a conventional faraday cup for beam measurement and a conventional thermionic neutralizer. GCIB generation is similar to as is shown in FIG. 1, but in the mechanically scanning GCIB processing apparatus 200 of FIG. 2, the GCIB 128 is stationary (not scanned) and the workpiece 152 is mechanically scanned through the GCIB 128 to distribute the effects of the GCIB 128 over a surface of the workpiece 152. An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the GCIB axis 129 of the GCIB 128 so that the GCIB 128 has an angle of beam incidence 206 with respect to the workpiece 152 surface. The angle of beam incidence 206 may be 90 degrees or some other angle, but is typically 90 degrees or very near 90 degrees. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 2, similar scanning and over-scan is performed in the (typically) orthogonal X-scan motion 208 direction (in and out of the plane of the paper). A total beam current sensor 218 is disposed beyond the workpiece holder 150 in the path of the GCIB 128 so as to intercept a sample of the total GCIB beam current $I_T$ of GCIB 128 when the workpiece holder 150 is scanned out of the path of the GCIB 128. The beam current sensor 218 is typically a faraday cup or the like, closed except for a beam-entry opening, and is affixed to the wall of the vacuum vessel 102 with an electrically insulating mount 212. A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 3A:
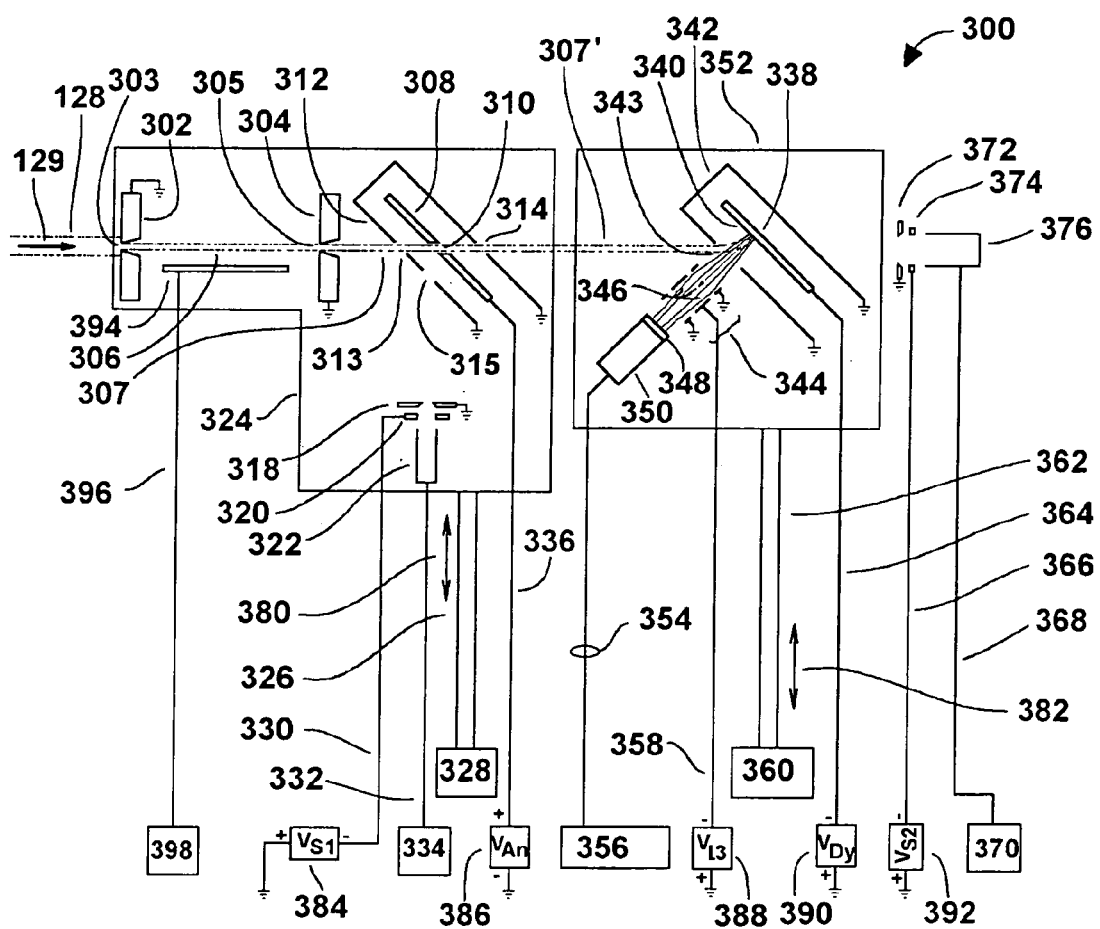
FIG. 3A is a schematic showing a first embodiment of the apparatus for making the beam measurements of the invention, wherein is depicted a case for an analyzer voltage of zero.
Figure 3B:
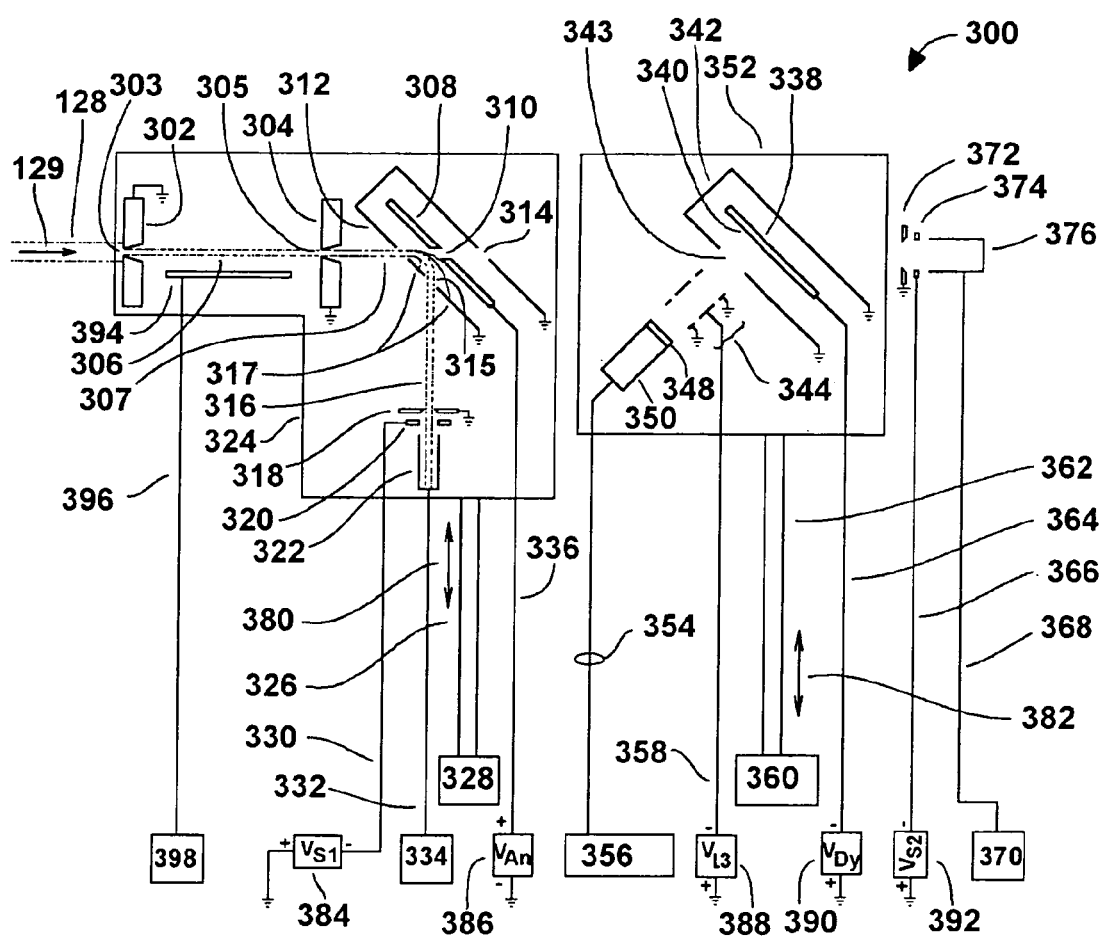

FIGS. 3A and 3B show schematics of a first embodiment of a GCIB measurement apparatus 300 for making the beam measurements of a GCIB 128 in accordance with the present invention. FIG. 3A depicts a case for an analyzer voltage of zero and FIG. 3B depicts a case for a non-zero analyzer voltage. The GCIB measurement apparatus 300 is intended to be situated (with the exception, optionally, of some or all supporting electronic circuits, power supplies, and controls) within the vacuum vessel 102 (FIG. 2) of a GCIB processing apparatus 200 (FIG. 2) having an unscanned GCIB 128, like that shown in FIG. 2, for example. The GCIB measurement apparatus 300 comprises a GCIB attenuation subsystem, a GCIB collimation subsystem, a GCIB switching subsystem, a GCIB energy spectrum measuring subsystem, a GCIB particle flow measurement subsystem, a GCIB current measurement subsystem, a GCIB time-of-flight measurement system, repositioning actuators for repositioning various elements with respect to the gas cluster ion beam being measured, and various electronic, power, and control systems.

Referring to FIG. 3A, the GCIB attenuation subsystem comprises a beam attenuator 302, and related actuators and controls. Beam attenuator 302 is (for example) a metal plate having a small circular attenuator aperture 303 through which an attenuated sample (attenuated GCIB 306) of the GCIB 128 can be made to pass. It is recognized that the attenuator aperture 303 may (for example) be a small circular aperture or a rectangular slit aperture or even an array of circular apertures and can be an adjustable aperture such as an iris or adjustable slit. In a preferred, non-limiting embodiment, the attenuator aperture 303 is a circular knife edge hole with 1 millimeter diameter. Beam attenuator 302 is mounted rigidly to analyzer mounting and alignment plate 324 and is thereby electrically grounded and thermally heat sunk. Analyzer mounting and alignment plate 324 is connected by mechanical linkage 326 to mechanical actuator 328 to provide bi-directional actuation (in the direction of arrows 380) for inserting the beam attenuator 302 into the GCIB 128 with attenuator aperture 303 aligned with the GCIB axis 129 or for removing the GCIB attenuator subsystem entirely from the GCIB 128.

Continuing to refer to FIG. 3A, the GCIB collimation subsystem comprises a beam attenuator 302, an attenuator aperture 303, and a beam collimator 304 having a collimator aperture 305, and related actuators and controls. Beam attenuator 302 and beam collimator 304 are mounted rigidly to analyzer mounting and alignment plate 324 and are thereby electrically grounded, thermally heat sunk, and maintained in alignment thereby. Attenuator aperture 303 and collimator aperture 305 are fixed in alignment by analyzer mounting and alignment plate 324 so as to be aligned substantially parallel with GCIB axis 129. It is recognized that the collimator aperture 305 may (for example) be a small circular aperture or a rectangular slit aperture or even an array of circular apertures and can be an adjustable aperture such as an iris or adjustable slit. Preferably the collimator aperture is the same shape (circular or slit) as is the attenuator aperture 303 and is of approximately equal size or smaller than the attenuator aperture 303. Thus the collimator aperture serves to collimate the attenuated GCIB 306 and to further attenuate the attenuated GCIB 306. In a preferred embodiment, the collimator aperture 305 is a circular knife edge hole with a diameter in the range of from 20 to 160 micrometers. Analyzer mounting and alignment plate 324 is connected by mechanical linkage 326 to mechanical actuator 328 to provide bi-directional actuation (in the direction of arrows 380) for inserting GCIB collimation subsystem into the GCIB 128 with attenuator aperture 303 and collimator aperture 305 both aligned with the GCIB axis 129 or for removing the GCIB collimation subsystem entirely from the GCIB 128. When the GCIB collimation subsystem is inserted, as shown in FIG. 3A, beam attenuator 302 and beam collimator 304 transmit (respectively) an attenuated GCIB 306 and an attenuated and collimated GCIB 307. Attenuated and collimated GCIB 307 is thus a sample of GCIB 128.

Continuing to refer to FIG. 3A, the GCIB switching subsystem comprises a beam attenuator 302, an attenuator aperture 303, a beam collimator 304 having a collimator aperture 305, an electrostatic deflector plate 394, and related actuators, power supplies and controls. Beam attenuator 302 and beam collimator 304 are mounted rigidly to analyzer mounting and alignment plate 324 and are thereby electrically grounded, thermally heat sunk, and maintained in alignment. Attenuator aperture 303 and collimator aperture 305 are fixed in alignment by analyzer mounting and alignment plate 324 so as to be aligned substantially parallel with GCIB axis 129. Analyzer mounting and alignment plate 324 is connected by mechanical linkage 326 to mechanical actuator 328 to provide bi-directional actuation 380 for inserting GCIB collimation subsystem into the GCIB 128 with attenuator aperture 303 and collimator aperture 305 both aligned with the GCIB axis 129 for transmitting an attenuated and collimated sample (attenuated and collimated GCIB 307) of GCIB 128 or for removing the GCIB collimation subsystem entirely from the GCIB 128. An electrostatic deflector plate 394 is positioned proximal to and substantially parallel to attenuated GCIB 306 where GCIB 306 passes between beam attenuator 302 and beam collimator 304 and is rigidly fixed to analyzer mounting and alignment plate 324 by electrical insulating means not shown. Electrical lead 396 connects electrostatic deflector plate 394 to a beam gating controller 398 for conducting beam gating potentials from beam gating controller 398 to electrostatic deflector plate 394. Beam gating controller 398 provides electrical signals to controllably deflect or not deflect attenuated GCIB 306 in the region between beam attenuator 302 and beam collimator 304. It is realized that beam gating controller 398 can be remotely controlled by a higher level control system (not shown in this figure) for controllably providing deflection signals to electrostatic deflector plate 394. By deflecting or not deflecting attenuated GCIB 306, attenuated and collimated GCIB 307 may be gated off or on. Accordingly when the GCIB switching subsystem is inserted into GCIB 128, it can form a beam switch for time-of-flight beam measurements as will be described in additional detail hereinafter.

Continuing to refer to FIG. 3A, the GCIB energy spectrum measuring subsystem (energy spectrometer) comprises a beam attenuator 302, an attenuator aperture 303, a beam collimator 304, a collimator aperture 305, a grounded electrode 312, an energy analyzer electrode 308, an analyzing slit 318, a current sensor 322, and related actuators, power supplies and controls. The grounded electrode 312 has three apertures—a first grounded electrode aperture 313 for admitting attenuated and collimated GCIB 307, a second grounded electrode aperture 314 to permit transmission of the attenuated and collimated GCIB 307', and a third grounded electrode aperture 315 for transmitting an analyzed beamlet 316 (shown in FIG. 3B). A beam energy analyzer comprises grounded electrode 312 and energy analyzer electrode 308. The grounded electrode 312 and the energy analyzer electrode 308 are disposed at an angle (preferably approximately 45 degrees) to the path of the attenuated GCIB 306 (thus to the GCIB axis 129). The grounded electrode 312 is rigidly fixed to the analyzer mounting and alignment plate 324 so is to be electrically grounded thereby. The energy analyzer electrode 308 is rigidly fixed to analyzer mounting and alignment plate 324 by electrical insulating means not shown. Electrical lead 336 connects energy analyzer electrode 308 to an analyzer power supply 386 for supplying an analyzer voltage $V_{An}$ to energy analyzer electrode 308. Analyzer power supply 386 is adjustable and preferably remotely controllable by a higher-level controller not shown in this figure. Analyzing voltage $V_{An}$ is controllable throughout the range from zero to a voltage approximately equal to the maximum acceleration voltage $V_{Acc}$ used for accelerating the GCIB 128. For example if the maximum expected value of $V_{Acc}$ is 25 kV, then $V_{An}$ can be chosen to be controllable over the range of from zero to 25 kV. Energy analyzer electrode 308 has an energy analyzer electrode aperture 310 through the electrode to allow transmission of attenuated and collimated GCIB 307. When transmitted through energy analyzer electrode aperture 310, the continuation of attenuated and collimated GCIB 307 is designated as attenuated and collimated GCIB 307'. Energy analyzer electrode aperture 310 is maintained in fixed alignment with attenuator aperture 303 and collimator aperture 305 by analyzer mounting and alignment plate 324. When $V_{An}$ is zero, the attenuated and collimated GCIB 307' travels straight through attenuator aperture 303 and collimator aperture 305 and first grounded electrode aperture 313 and through energy analyzer electrode aperture 310 and through second grounded electrode aperture 314.

Referring to FIG. 3B, but continuing discussion of the GCIB energy spectrum measuring subsystem (energy spectrometer), when $V_{An}$ is greater than zero, an electrostatic field gradient exists between energy analyzer electrode 308 and grounded electrode 312 such that the attenuated and collimated GCIB 307 is deflected and dispersed, with cluster ions being dispersed as a function of their E/q (energy per charge). An analyzing slit 318 forms an acceptance aperture for a current sensor 322, which is preferably a faraday cup having an electron suppressor electrode 320. An electrical lead 330 connects suppressor electrode 320 to suppressor power supply 384 for supplying a suppressor voltage, $V_{S1}$ to suppressor electrode 320 for suppressing secondary electrons in current sensor 322. $V_{S1}$ is preferably in the range of from 500 to 1500 volts. According to known principles, different values of $V_{An}$ result in cluster ions of a specific range of energies, dependent on $V_{An}$, being deflected so as to pass through third grounded electrode aperture 315 and to form an analyzed beamlet 316 passing through analyzing slit 318 for measurement by the current sensor 322. Cluster ions having E/q differing from the range of E/q of the cluster ions in analyzed beamlet 316 are deflected greater or lesser amounts than analyzed beamlet 316 and form dispersed beamlets 317. Dispersed beamlets 317 do not pass through analyzing slit 318 and are not measured by current sensor 322. Current sensor 322 has an electrical lead 332 for connecting it to a current measurement system 334. According to known principles of electrostatic energy spectroscopy, by coordinating adjustment of $V_{An}$ through its voltage range, with current measurements in current sensor 322 the energy spectrum (data in the form of beam current as a function of cluster ion energy or alternatively in the form of cluster ion energy as a function of beam current) of the attenuated and collimated GCIB 307 sample of GCIB 128 are measured and an average value of E/q (corresponding to $$\left(\frac{E}{q}\right)_{average}$$

in Eqn. 3) is calculated. Furthermore, the total cluster ion current, I, in the attenuated and collimated GCIB 307 can be obtained by integrating the measurement of beam current as a function of cluster ion energy with respect to cluster ion energy. Such a measurement of cluster ion current, I, can be used in combination with a flow rate, Γ, measurement for calculating average charge state of the attenuated and collimated GCIB 307.

Referring again to FIG. 3A, the GCIB particle flow measurement subsystem comprises a beam attenuator 302, an attenuator aperture 303, a beam collimator 304, a collimator aperture 305, an energy analyzer electrode aperture 310, a grounded electrode 342 with a fourth grounded electrode aperture 343, a dynode 338, an optional electron lens assembly 344, a scintillation measurement system, and related actuators, power supplies and controls. The GCIB particle flow measurement subsystem measures the flow rate Γ of clusters in a sample of the GCIB 100. Beam attenuator 302 and beam collimator 304 are mounted rigidly to analyzer mounting and alignment plate 324 and are thereby electrically grounded, thermally heat sunk, and maintained in alignment. Analyzer voltage $V_{An}$ is set to zero so that attenuated and collimated GCIB 307 is transmitted through the energy analyzer electrode aperture 310 as attenuated and collimated GCIB 307'. Grounded electrode 342 with a fourth grounded electrode aperture, dynode 338, optional electron lens assembly 344, which if used, is preferably an einzel lens, scintillator 348, and a photomultiplier tube (PMT) 350 are all rigidly mounted to a particle detector mounting and alignment plate 352. When electron lens assembly is used, an electrical lead 358 connects electron lens assembly to lens power supply 388 for providing focusing voltage $V_{L3}$ for focusing secondary electron trajectories 346 onto scintillator 348.

Particle detector mounting and alignment plate 352 supports and maintains alignment of elements mounted to it and permits their positioning, as a group. Particle detector mounting and alignment plate 352 is connected by mechanical linkage 362 to mechanical actuator 360 to provide bi-directional actuation (in the direction of arrows 382) for inserting the dynode 340 into the attenuated and collimated GCIB 307' for cluster ion flow rate measurement. The grounded electrode 342 is rigidly mounted to the particle detector and mounting plate 352 and is electrically grounded thereby. The dynode is rigidly mounted to the particle detector and mounting plate 352 by electrical insulating means not shown. Both the grounded electrode 342 and the dynode are disposed at an angle (preferably approximately 45 degrees) to the path of the attenuated and collimated GCIB 307' (thus to the GCIB axis 129). Dynode 338 is an electrical conductor, preferably aluminum, and has a dynode surface 340, preferably a thin native aluminum oxide film. An electrical lead 364 connects the dynode 338 to a dynode power supply 390 for supplying a dynode voltage $V_{Dy}$ to the dynode 338. Dynode power supply 390 is preferably remotely controllable by a higher level controller for setting $V_{Dy}$ to zero volts when particle detection is not being performed and to set it to a fixed value, preferably in the range of 20–45 kV and typically 30 kV when particle detection is performed. In operation, attenuated and collimated GCIB 307' passes through fourth grounded electrode aperture 343 in the grounded electrode 342. An electric potential gradient between the dynode 338 and grounded electrode 342 accelerates the attenuated and collimated GCIB 307' into the dynode 338. As each accelerated cluster ion strikes the dynode surface 340, it induces release of one or more secondary electrons.

The secondary electrons are accelerated by the electric field gradient between the dynode 338 and the grounded electrode 342 along trajectories 346 in a direction substantially normal to the dynode surface 340 and are focused by electron lens assembly 344 onto a scintillator 348. The electron lens assembly 344 is optional, but is useful for assuring detection of electrons at the scintillator with a relatively small scintillator. Each cluster ion arriving at the dynode surface releases a burst of one or more secondary electrons, which is converted by the scintillator 348 to a photon pulse. Scintillator 348 is a conventional particle detecting scintillator known in the art (preferably a plastic scintillator). Scintillator 348 and is shielded from external light sources by a thin aluminized Mylar film and is optically coupled to a high speed PMT 350. An electrical cable 354 connects PMT 350 to a conventional PMT controller/pulse counter/sampling system 356. The PMT controller/pulse counter/sampling system 356 provides and controls power supply potentials to the PMT and processes the PMT output pulses to provide pulse rate measurements and also processes the PMT output to collect periodic samples of the PMT output signal for measuring the fall-off of the signal during time-of-flight measurement, as further described hereinafter. The PMT 350 produces a pulse output corresponding to each photon pulse detected, thus corresponding to each cluster ion that strikes the dynode surface 340. PMTs capable of counting photon pulse rates of at least 100 MHz are commercially available. The PMT controller/pulse counter/sampling system 356 is remotely controllable and can output its pulse rate and sampling measurements for remote reading. The beam attenuator aperture 303 is pre-selected to have a diameter so as to provide an overall attenuation of the GCIB 128 as to assure that the cluster ion flow rate in the attenuated and collimated GCIB 107' is at an accurately countable rate by the PMT 350. For presently typical examples of GCIB 100 this attenuation factor is on the order of $10^{-6}$ to $10^{-7}$, which can be achieved by using an attenuator aperture on the order of 20 micrometers diameter. The measured cluster ion flow rate in the attenuated and collimated GCIB 307' is designated Γ, and corresponds to the Γ in Eqn. 2.

Continuing to refer to FIG. 3A, a first example of a GCIB current measurement subsystem for implementing the invention comprises a grounded aperture 372, a secondary electron suppressor 374, and a beam current sensor 376. The aperture 372, secondary electron suppressor, and beam current sensor 376 are rigidly mounted (not shown here) so as to be aligned with the GCIB axis 129 of GCIB 128 (and thus also aligned with attenuated and collimated GCIB 307'). In the absence of intervening elements, GCIB 128 or a sample of GCIB 128 (attenuated and collimated GCIB 307', for example) is collected by current sensor 376 for measurement. Current sensor 376 is preferably a faraday cup. An electrical lead 366 connects secondary electron suppressor 374 to a suppressor power supply 392 for supplying a suppressor voltage $V_{S2}$ to the secondary electron suppressor 374 for suppressing secondary electrons in the current sensor 376. $V_{S2}$ is preferably in the range of from 500 to 1500 volts. An electrical lead 368 connects current sensor 376 to electrical current measuring system 370 for electrical current measurement.

Referring again to FIG. 3B, a second and preferred example of a GCIB current measurement subsystem for implementing the invention utilizes the current sensor 322 (preferably a faraday cup) of the energy spectrum measuring subsystem for measuring the beam current, I, of the attenuated and collimated GCIB 307. When $V_{An}$ is greater than zero, an electrostatic field gradient exists between energy analyzer electrode 308 and grounded electrode 312 such that the attenuated and collimated GCIB 307 is deflected and dispersed, with cluster ions being dispersed as a function of their E/q (energy per charge). An analyzing slit 318 forms an acceptance aperture for the current sensor 322, which is preferably a faraday cup having an electron suppressor electrode 320. An electrical lead 330 connects suppressor electrode 320 to suppressor power supply 384 for supplying a suppressor voltage, $V_{S1}$ to suppressor electrode 320 for suppressing secondary electrons in current sensor 322. $V_{S1}$ is preferably in the range of from 500 to 1500 volts. By coordinating adjustment of $V_{An}$ through its voltage range, with current measurements in current sensor 322 the energy spectrum (in the form of beam current as a function of cluster ion energy) of the attenuated and collimated GCIB 307 sample of GCIB 128 is measured and the cluster ion current, I, in the attenuated and collimated GCIB 307 can be obtained by integrating the measurement of beam current as a function of cluster ion energy with respect to cluster ion energy. Γ is the corresponding measured cluster ion flow rate in the attenuated and collimated GCIB 307. Collection efficiencies α and β are determined by conventional calibration techniques and thus $\bar{q}$ is calculated according to Eqn. 2. Average energy/charge, $$\left(\frac{E}{q}\right)_{average}$$

is also measured as described hereinbefore and accordingly $\bar{E}$ is calculated according to Eqn. 3. Since attenuated and collimated GCIB 307' is a sample of GCIB 128, the calculated values of $\bar{q}$ and $\bar{E}$ correspond to those for GCIB 128.

Figure 4:
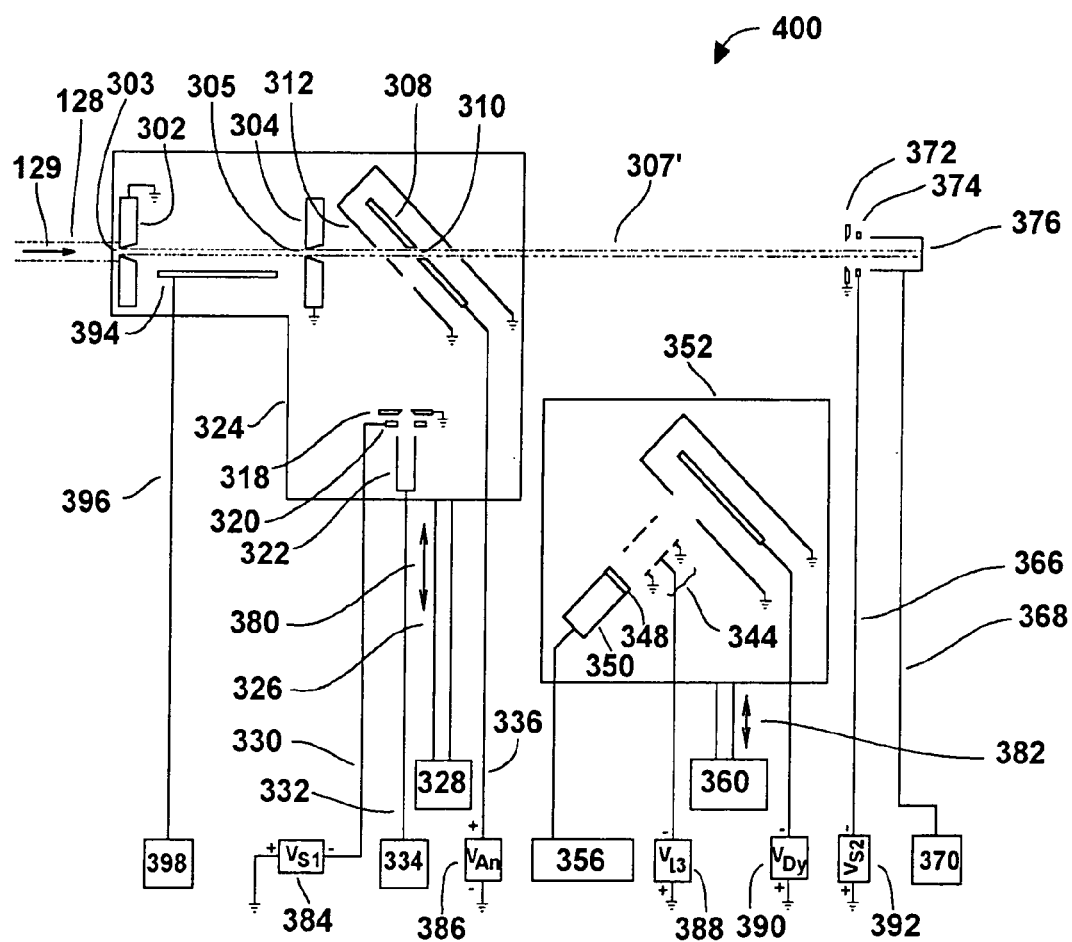
FIG. 4 is a schematic showing a first embodiment of the apparatus for making the beam measurements of the invention configured for measuring the current I of a sample of the beam.

FIG. 4 shows a schematic 400 of the first embodiment of a GCIB measurement apparatus configured for making a sample beam current measurement using the first example GCIB current measurement subsystem. Mechanical actuator 360 removes the particle detector mounting and alignment plate 352 from the path of the attenuated and collimated GCIB 307', which is a sample of GCIB 128. When the analyzer mounting and alignment plate 324 is positioned so that the GCIB attenuation and collimation subsystems are inserted into the GCIB 128 and the particle detector mounting and alignment plate 352 is removed from the path of attenuated and collimated GCIB 307' (as shown in FIG. 4), then the attenuated and collimated GCIB 307', which is a sample of GCIB 128 is collected by the current sensor 376 for measurement as the sample beam current value I of Eqn. 2 is the current in the attenuated and collimated GCIB 307', while Γ is the corresponding measured cluster ion flow rate in the attenuated and collimated GCIB 307'. Collection efficiencies α and β are determined by conventional calibration techniques and thus $\bar{q}$ is calculated according to Eqn. 2. Average energy/charge, $$\left(\frac{E}{q}\right)_{average}$$

is also measured as described hereinbefore and accordingly $\bar{E}$ is calculated according to Eqn. 3. Since attenuated and collimated GCIB 307' is a sample of GCIB 128, the calculated values of $\bar{q}$ and $\bar{E}$ correspond to those for GCIB 128.

Figure 5:
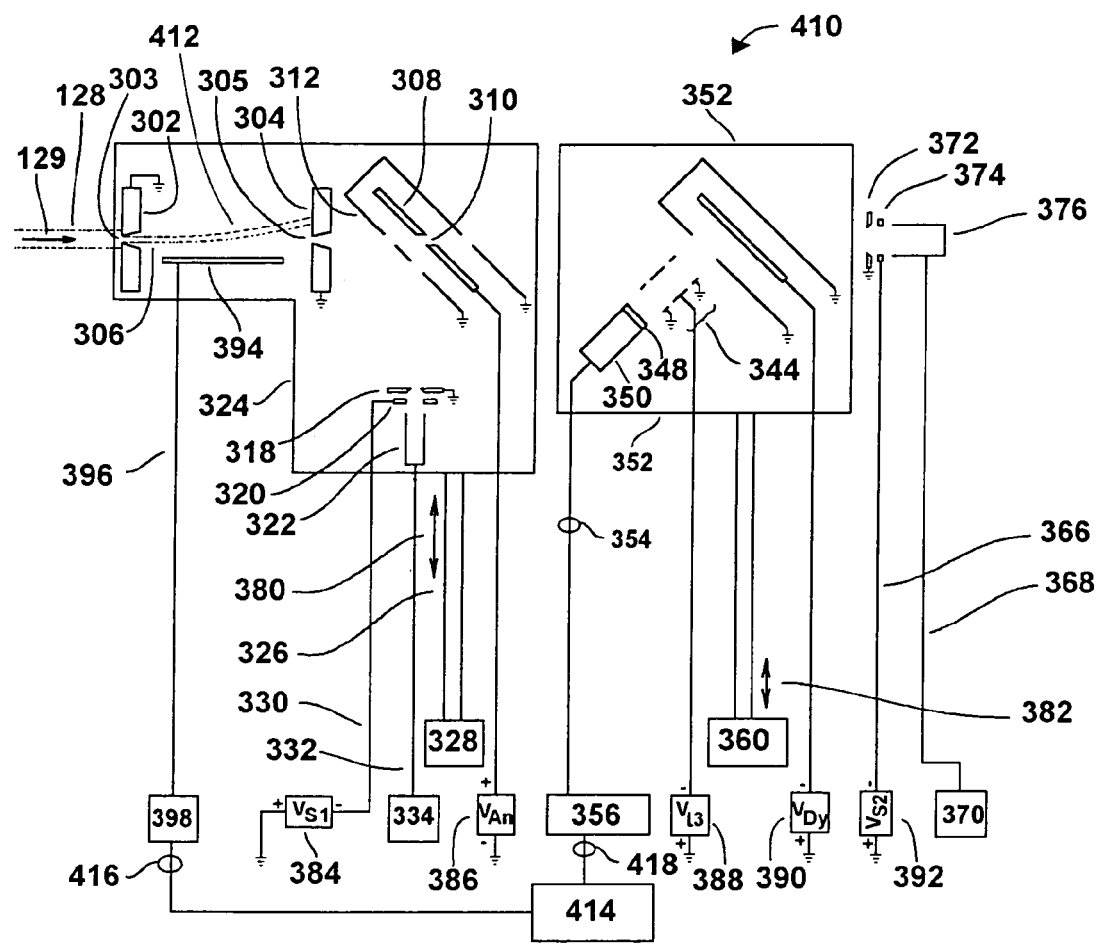
FIG. 5 is a schematic showing a first embodiment of the apparatus for making the beam measurements of the invention, illustrating beam gating for time-of-flight measurements on a sample of the beam.

FIG. 5 shows a schematic 410 of the first embodiment of the GCIB measurement apparatus of the invention, configured for gating a sample of the GCIB 128 for making time-of-flight measurements on the beam sample. The analyzer mounting and alignment plate 324 and the particle detector mounting and alignment plate 352 are both positioned so that the GCIB attenuation and collimation subsystems are inserted into the GCIB 128 and the particle detector mounting and alignment plate 352 is in the path of attenuated and collimated GCIB 307' (as was shown in FIG. 3A). The time-of-flight measurement is done by beginning with the beam conditions shown in FIG. 3A, with the attenuated and collimated GCIB 307'striking dynode 338 and being sensed by PMT 350. Referring again to FIG. 5, beam gating controller 398 provides electrical signals to controllably deflect the attenuated GCIB 306 in the region between beam attenuator 302 and beam collimator 304. This results in attenuated GCIB 306 (FIG. 3A) being deflected as attenuated and deflected GCIB 412 (FIG. 5). The deflection results in abrupt gating off of the previously (as was shown in FIG. 3A) attenuated and collimated GCIB 307'–307', which results in a delayed (according to the times-of-flight of the component clusters having various energies in the attenuated and collimated GCIB 307–307') fall-off of signal in the PMT 350. The electrical cable 354 connects PMT 350 to PMT controller/pulse counter/sampling system 356 for measuring the delayed fall-off signal in the PMT 350, which occurs after the gating off of the attenuated and collimated GCIB 307—307.

A time-of-flight analysis and control system 414 is controllably connected to both the beam gating controller 389 and the PMT controller/pulse counter/sampling system 356 by electrical cables 416 and 418 respectively. The time-of-flight analysis and control system 414 also receives measurement information about the delayed fall-off signal in the PMT 350 via the electrical cable 418. The process for measuring cluster ion time-of-flight begins with the GCIB measurement apparatus 300 configured as shown in the previous FIG. 3A, with attenuated and collimated GCIB 307' being collected by the beam current sensor 376. The time-of-flight analysis and control system 414 sends control signals to the PMT controller/pulse counter/sampling system 356 to cause it to collect and send periodic samples of the signal sensed at PMT 350. At a time $T_0$, the time-of-flight analysis and control system 414 sends control signals to beam gating controller 398 commanding the attenuated and collimated GCIB 307' to be gated off, as shown in FIG. 5. The resulting fall-off of signal at beam PMT 350 is periodically sampled and sent to the time-of-flight analysis and control system 414 by the PMT controller/pulse counter/sampling system 356. The rate and timing of the fall-off of signal at the PMT 350 is analyzed in relation to the time $T_0$ of beam gating by the beam gating controller 398 according to principles as taught in US patent application publications 2002-0036261A1, Dykstra; and 2002-0070361A1, Mack et al., for example. US patent application publications 2002-0036261A1, Dykstra; and 2002-0070361A1, Mack et al. are incorporated herein by reference. Accordingly, the time-of-flight distribution for the attenuated and collimated GCIB 307–307' is measured. By conventional averaging techniques, the average time-of-flight is calculated from the time-of-flight distribution and the average velocity, $\bar{v}$, is the inverse of the average time-of-flight. This calculated value of average velocity $\bar{v}$ is the value $\bar{v}$ for Eqn. 5. By combining this value of $\bar{v}$ with the value of $\bar{E}$ calculated according to Eqn. 3, next is calculated the value of average mass $\bar{m}$ according to Eqn. 5. Therefore, according to the methods and apparatus of the first embodiment of the invention, average mass $\bar{m}$, average velocity $\bar{v}$, average energy $\bar{E}$, average charge state $\bar{q}$, and average energy/charge $$\left(\frac{E}{q}\right)_{average}$$

are determined for the sample of the beam and therefore for the GCIB 128. It is recognized that the time-of-flight analysis and control system 414 could optionally be implemented as part of a higher level or more general control system, a microcomputer system, or other general-purpose computer system, which might be part of an overall control system for a GCIB processing system.

Figure 6:
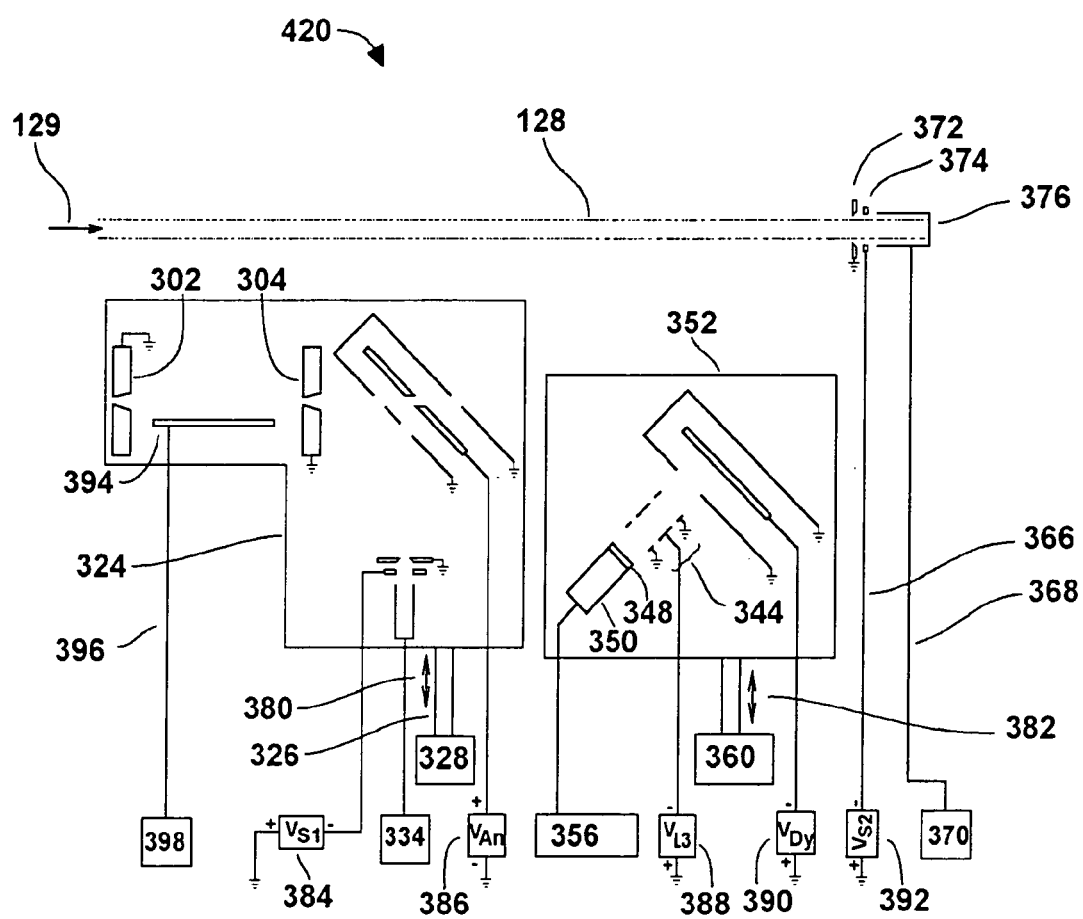
FIG. 6 is a schematic showing a first embodiment of the apparatus of the invention for making the beam measurements, with improvements removed from the beam path to permit measurement of the current of the entire beam.

FIG. 6 shows a schematic 420 of the first embodiment of the GCIB measurement apparatus of the invention, but with the measurement improvements removed from the beam path to permit measurement of the current of the entire GCIB 128. The analyzer mounting and alignment plate 324 is positioned so that the subsystems it supports are removed entirely from the GCIB 128 and the particle detector mounting and alignment plate 352 is also positioned so that the subsystems it supports are removed entirely from the GCIB 128. GCIB 128 travels uninterrupted to the current sensor 376 where it is collected for measurement. This permits measurement of total beam current $I_T$ of the GCIB 128 for workpiece processing dosimetry purposes.

Figure 7:
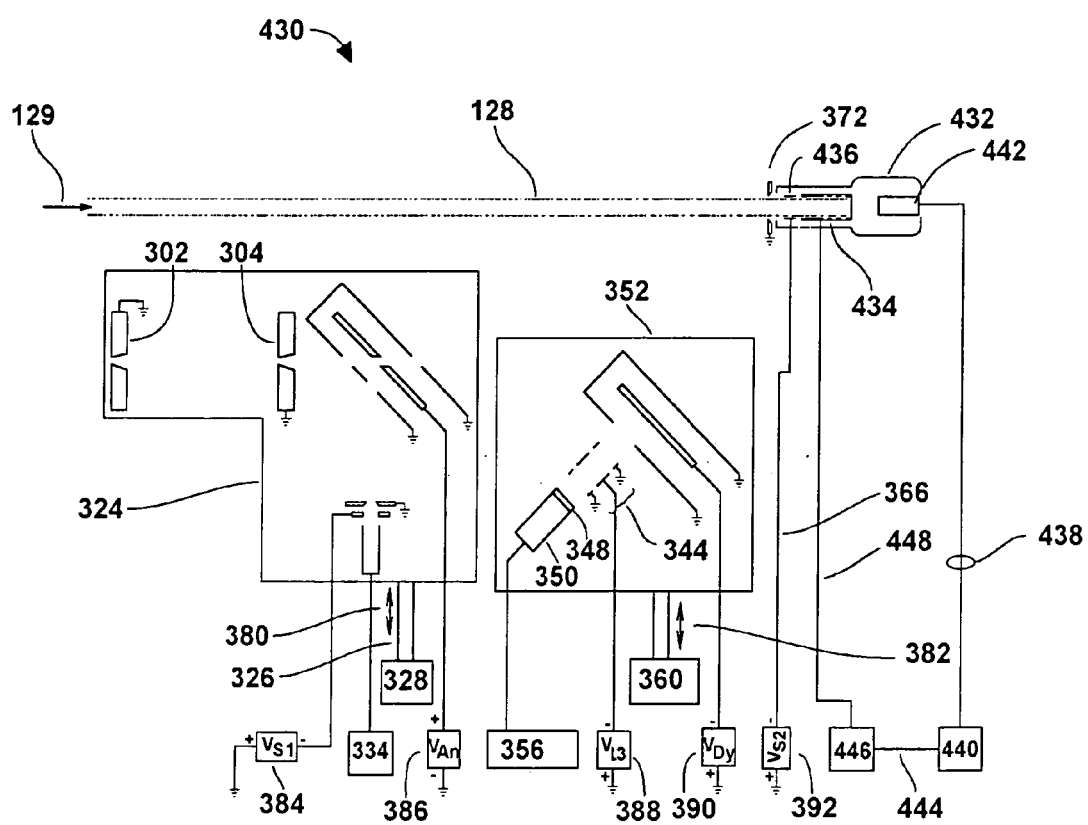
FIG. 7 is a schematic of a second embodiment of the apparatus of the invention for making the beam measurements.

FIG. 7 shows a schematic of a second embodiment of a GCIB measurement apparatus 430 for making the beam measurements of the invention upon a GCIB 128. In the second embodiment, the method does not include a time-of-flight measurement, but rather makes measurements of average mass per charge $$\left(\frac{m}{q}\right)_{average}$$

of the beam, and of average energy per charge, $$\left(\frac{E}{q}\right)_{average},$$

and average charge state $\bar{q}$ on a sample of the cluster ion beam. The average energy per charge and the average charge state are measured identically and with the same apparatus as used for the first embodiment and as has been described hereinbefore. The average mass per charge is measured using a pressure-charge sensor, according to known techniques. The measurement apparatus is like the apparatus of the first embodiment described hereinbefore, except that since no time-of-flight measurement is required, the previously described electrostatic deflector plate 394, electrical lead 396, and beam gating controller 398 of the GCIB switching subsystem are not required. Also the separate secondary electron suppressor 374, the beam current sensor 376, electrical lead 368 and current measuring system 370 previously described are not required. Beam current measurement and average mass per charge are performed using apparatus and methods as are now described. A (m/q) sensor 432 comprises a perforated faraday cup 434 with a secondary electron suppressor 436 and a pressure sensor 442. The grounded aperture 372 and (m/q) sensor 432 are rigidly mounted (not shown here) so as to be aligned with the GCIB axis 129 of GCIB 128. In the absence of intervening elements, the perforated faraday cup 434 collects GCIB 128 for current measurement. Gas cluster ions in the GCIB 128 are fully dissociated upon impact with the perforated faraday cup 434 and they raise the pressure in the (m/q) sensor 432 as they escape. Pressure sensor 442 measures the pressure increase due to dissociated gas cluster ions and measures the temperature of the sensor. An electrical lead 366 connects secondary electron suppressor 436 to a suppressor power supply 392 for supplying a suppressor voltage $V_{S2}$ to the secondary electron suppressor 374 for suppressing secondary electrons in the perforated faraday cup 434. $V_{S2}$ is preferably in the range of from 500 to 1500 volts. An electrical lead 448 connects perforated faraday cup to a conventional current measurement system 446 for electrical current measurement. An electrical cable 438 connects pressure sensor 442 to a (m/q) measurement system 440 for transmitting pressure and temperature signals and sensor power. An electrical lead 444 transmits electrical current measurement signals from current measurement system 446 to the (m/q) measurement system 440. The current measurement system 446 and the (m/q) measurement system 440 are both remotely controllable and able to provide data signals to a higher-level controller, not shown here. The (m/q) sensor 432, the current measurement system 446, and the (m/q) measurement system 440 operate according to principles taught in US patent application publication 2001-0054686A1 Torti et al., for example. US patent application publication 2001-0054686A1 Torti et al. is incorporated herein by reference. Equation 10 of 2001-0054686A1 Torti et al. describes the measurement for $\bar{N}$, the average number of molecules per cluster. By multiplying $\bar{N}$, thus obtained, by 40 (the atomic mass of Argon) and by the value of the atomic mass unit in kg, is obtained the value of average mass per charge, $$\left(\frac{m}{q}\right)_{average},$$

for the clusters in the GCIB 128. This value for average mass per charge is the $$\left(\frac{m}{q}\right)_{average}$$

required in Eqn. 4. The current measurement of the GCIB 128 from the current measurement system 446 is $I_T$, the total beam current for the GCIB 128 and is used for GCIB processing dosimetry. By combining this value for average mass per charge with measurements of $\Gamma$, I, and average energy per charge, $$\left(\frac{E}{q}\right)_{average},$$

obtained according to the methods and apparatus of the first embodiment of the invention described above, and by applying Eqn. 2, Eqn. 3, and Eqn. 4, average mass $\bar{m}$, average charge state $\bar{q}$, and average energy $\bar{E}$ are determined for the GCIB 128 according to the second embodiment of the invention.

Figure 8:
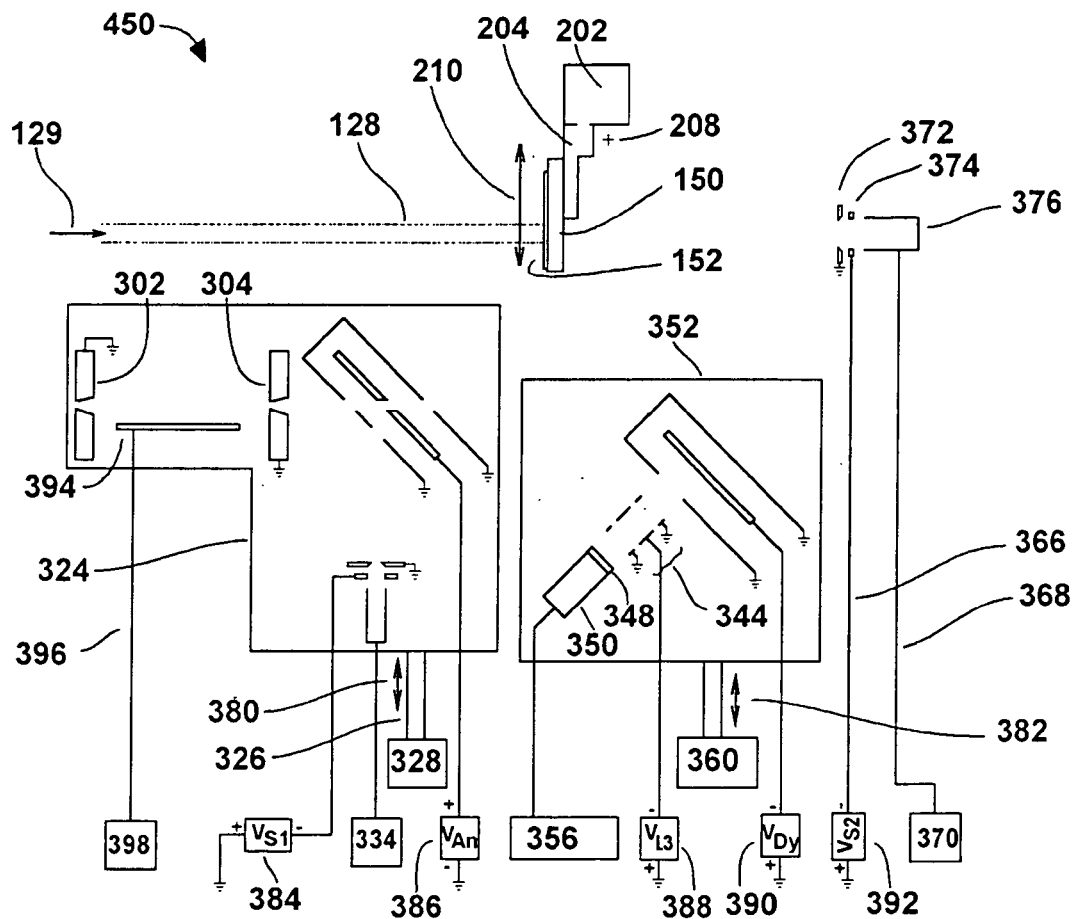
FIG. 8 is a schematic showing a first embodiment of the apparatus of the invention for making the beam measurements, with improvements removed from the beam and a workpiece inserted into the beam for processing.

FIG. 8 shows a schematic 450 of the first embodiment of the GCIB measurement apparatus of the invention, but with the measurement improvements removed from the beam path to permit processing of a workpiece by GCIB irradiation using the entire GCIB 128. The analyzer mounting and alignment plate 324 is positioned so that the subsystems it supports are removed entirely from the GCIB 128 and the particle detector mounting and alignment plate 352 is also positioned so that the subsystems it supports are removed entirely from the GCIB 128 and from the scanning path of a mechanically scanning workpiece holder 150 with a workpiece 152. GCIB 128 travels uninterrupted to the workpiece 152 where it irradiates the workpiece for GCIB processing of the workpiece 152. The workpiece holder 150 and workpiece 152 are scanned through the GCIB 128 with X-scan and Y-scan motions 208 and 210, using apparatus and methods equivalent to those previously described in more detail in the discussion of the mechanically scanning GCIB processing apparatus 200 (see discussion of FIG. 2, hereinbefore).

Figure 9:
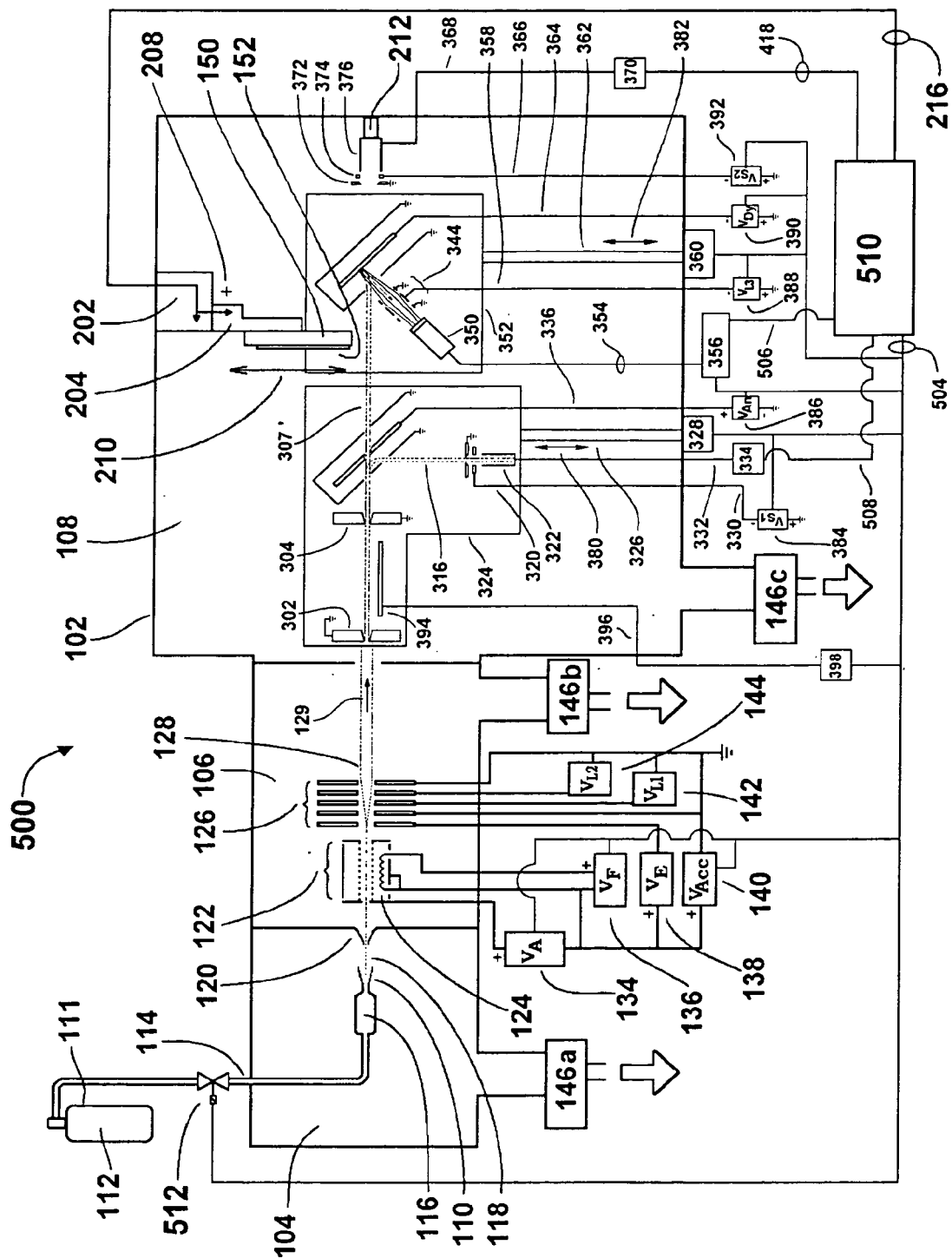
FIG. 9 is a schematic showing a GCIB processing apparatus according to the first embodiment of the invention.

FIG. 9 is a schematic showing an improved GCIB measurement and processing apparatus 500 according to a preferred first embodiment of the invention. GCIB measurement and processing apparatus 500 is similar to the prior art mechanically scanning GCIB processing apparatus 200, but having GCIB measurement, monitoring, and control improvements for implementing the first embodiment of the invention. Gas metering valve 113 of the prior art processing system is replaced by electronically controllable gas metering valve 512. The beam current sensor 218 of the prior art system and its electrical lead 214 are replaced by aperture 372, secondary electron suppressor 374, beam current sensor 376, and electrical lead 368 of the hereinbefore described GCIB measurement apparatus 300. Controller 220 of the prior art system is replaced by digital processing and control system 510 having improved capabilities and functions, including but not limited to all the hereinbefore described functionality of controller 220 and time-of-flight analysis and control system 414. Digital processing and control system 510 also includes the capability to control analyzer power supply 386 and to receive signals from current measurement system 334 and to coordinate adjustment of $V_{an}$ with measurement of current signals from current sensor 322 to perform beam energy spectrum measurement, with data in the form of beam current as a function of cluster ion energy or alternatively in the form of cluster ion energy as a function of beam current, of the attenuated and collimated GCIB 307 sample of GCIB 128 and to integrate the measurement of beam current as a function of cluster ion energy with respect to cluster ion energy to determine the cluster ion current, I, in the attenuated and collimated GCIB 307.

Digital processing and control system 510 may be, for example, a small general-purpose computer for general control of a GCIB processing system. Digital processing and control system 510 has a control bus 504 for communicating with and controlling other devices and/or subsystems. Anode power supply 134, filament power supply 136, and accelerator power supply 140 are each equipped with remote control capabilities and are controllably connected to the digital processing and control system 510 for control thereby via control bus 504. Electronically controllable gas metering valve 512 is also controllably connected to the digital processing and control system 510 for control thereby via control bus 504. Electrical lead 508 connects current measurement system 334 with digital processing and control system 510 for transmitting current measurement signals from current sensor 322. The improved GCIB measurement and processing apparatus 500 additionally incorporates all of the elements of the hereinbefore-described GCIB measurement apparatus 300. Digital processing and control system 510 communicates with and controls (via control bus 504) at least the following devices: suppressor power supply 384, for switching $V_{S1}$ on or off; the beam gating controller 398 for sending beam gating commands; mechanical actuators 328 and 360 for commanding positioning of (respectively) analyzer mounting and alignment plate 324 and particle detector mounting and alignment plate 352 with respect to GCIB axis 129; anode power supply 134, for controlling $V_A$; filament power supply 136, for controlling $V_F$; accelerator power supply 140, for controlling $V_{Acc}$; electronically controllable gas metering valve 512, for controlling source gas 112 flow through nozzle 110 and/or source gas pressure in stagnation chamber 116; analyzer power supply 386, for controlling $V_{An}$; optionally, if included, lens power supply 388 for controlling $V_{L3}$; dynode power supply 390, for controlling $V_{Dy}$; suppressor power supply 392, for switching $V_{S2}$ on or off; and PMT controller/pulse counter/sampling system 356 for controlling supply voltages for PMT 350 and for enabling or disabling pulse detection and signal sampling by PMT 350 and for controlling transmission of pulse count (Γ measurement) information from PMT controller/pulse counter/sampling system 356 to 510 via electrical lead 506. The digital processing and control system 510 controllably connects to the X-scan actuator 202 and the Y-scan actuator 204 through electrical cable 216 and controls the X-scan actuator 202 and the Y-scan actuator 204 so as to place the workpiece 152 into or out of the path of GCIB axis 129 and can remove the workpiece holder 150 to a position, as shown in FIG. 9, where it does not collide with nor interfere with the function of components mounted on particle detector mounting and alignment plate 352. When the analyzer mounting and alignment plate 324, the particle detector mounting and alignment plate 354, and the workpiece holder 152 are positioned as shown in FIG. 9, then $$\left(\frac{E}{q}\right)_{average}$$

and Γ are measured by the digital processing and control system 510 according to the methods hereinbefore-described. When the digital processing and control system 510 commands retraction of the particle detector mounting and alignment plate 352 from the GCIB axis 129, the configuration shown in FIG. 4 is obtained and beam current value I is measured according to the method hereinbefore-described. Using the configuration shown in FIGS. 4 and 5, the digital processing and control system 510 commands beam gating controller 398 to gate the beam off and measures the average velocity $\bar{v}$ by time of methods hereinbefore-described. Digital processing and control system 510 calculates $\bar{q}$ according to Eqn. 2, and calculates $\bar{E}$ according to Eqn. 3, and calculates $\bar{m}$ according to Eqn. 5.

Figure 10:
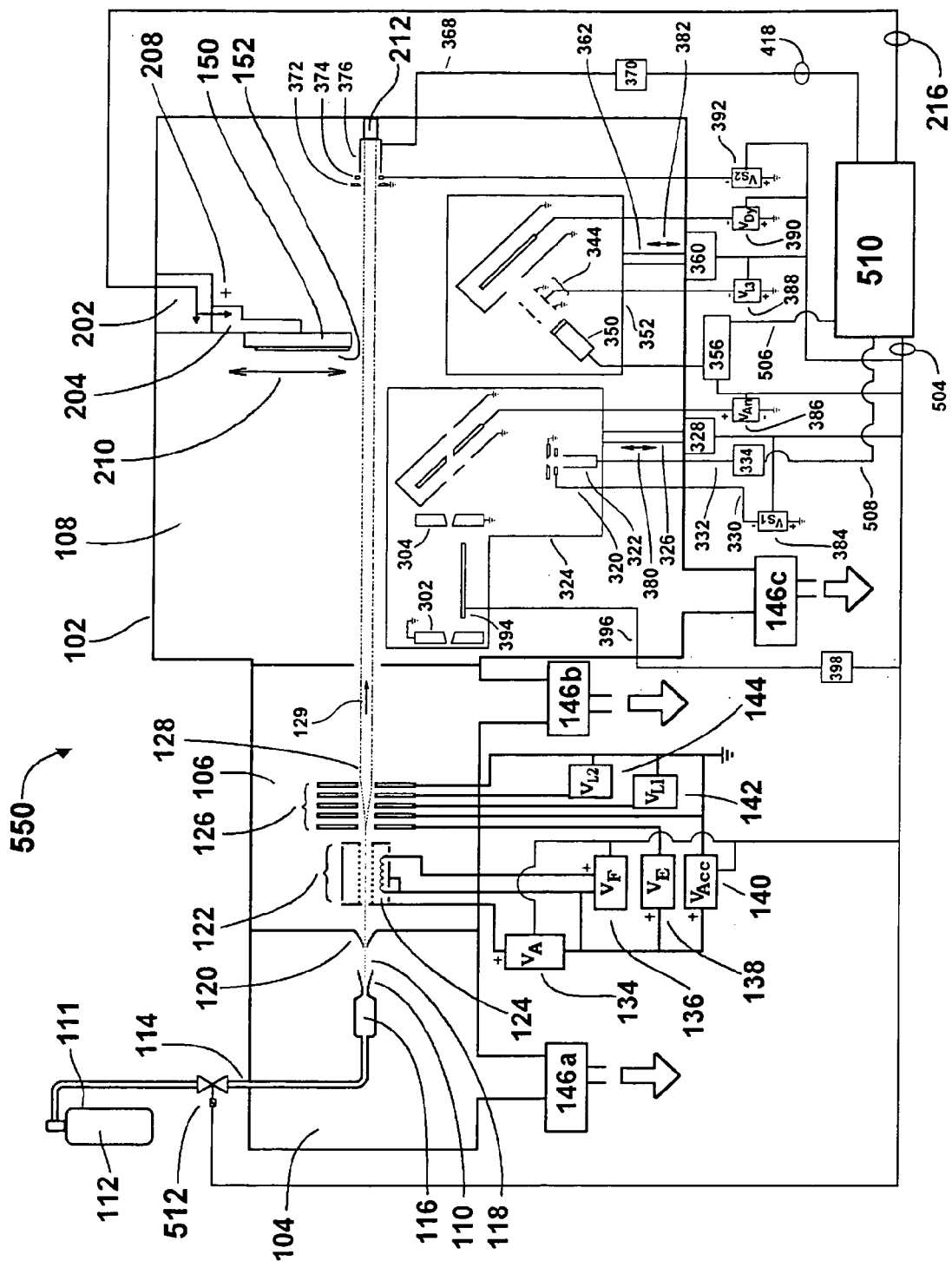
FIG. 10 is a schematic showing a GCIB processing apparatus according to the first embodiment of the invention, with the beam measurement apparatus removed from the beam to allow workpiece processing.

FIG. 10 is a schematic 550 showing the improved GCIB measurement and processing apparatus according to the preferred first embodiment of the invention, with the beam measurement apparatus removed from the beam to allow workpiece processing. As shown, both the analyzer mounting and alignment plate 324 and the particle detector mounting and alignment plate have been retracted from the path of the GCIB 128 by command of the digital processing and control system 510. A workpiece 152, which may be a semiconductor wafer, is held by workpiece holder 150. Workpiece holder is manipulated by the X-scan actuator 202 and the Y-scan actuator 204 under control of the digital processing and control system 510 so as to place the workpiece 152 into or out of the path of GCIB 128 and to scan the workpiece 152 uniformly relative to the GCIB 128 to achieve uniform processing of the workpiece 152 by the GCIB 128. Controller 510 receives the sampled beam current collected by the beam current sensor 376 by way of lead 368 and current measuring system 370 and thereby monitors the GCIB 128 and controls the GCIB dose received by the workpiece 152 by removing the workpiece 152 from the GCIB 128 when a predetermined desired dose has been delivered. Prior to initiation of processing of a workpiece by GCIB, desired target values or limiting values for any or all of $\bar{E}$, $I_T$, $\bar{m}$ and $\bar{q}$ are chosen and stored within the digital processing and control system 510. For the GCIB parameters for which target or limiting values are stored, the digital processing and control system 510 measures those GCIB parameters on the GCIB 128 as described hereinbefore. Any GCIB parameters that are measured as not in compliance with the stored limits or targets are adjusted under control of the digital processing and control system 510. $\overline{E}$ is adjusted, for example, by adjusting $V_{Acc}$. $I_T$ is adjusted, for example, by adjusting electronically controllable gas metering valve 512 and/or by adjusting $V_A$ and/or by adjusting $V_F$. $\overline{m}$ is adjusted, for example, by adjusting electronically controllable gas metering valve 512. $\overline{q}$ is adjusted, for example, by adjusting $V_A$ and/or $V_F$. When GCIB parameters, for which desired target values or limiting values have been stored, have all been obtained by automatic adjustment, the digital processing and control system 510 proceeds with the processing of the workpiece 152. The digital processing and control system 510 monitors and, if necessary adjusts, GCIB parameters for which desired target values or limiting values have been stored prior to the processing of each workpiece. If the digital processing and control system 510 is unable, by system adjustments, to achieve the stored beam target or limit values, it halts processing and signals (through display means, not shown) a human operator, thus avoiding misprocessing of the workpiece or workpieces.

Figure 11:
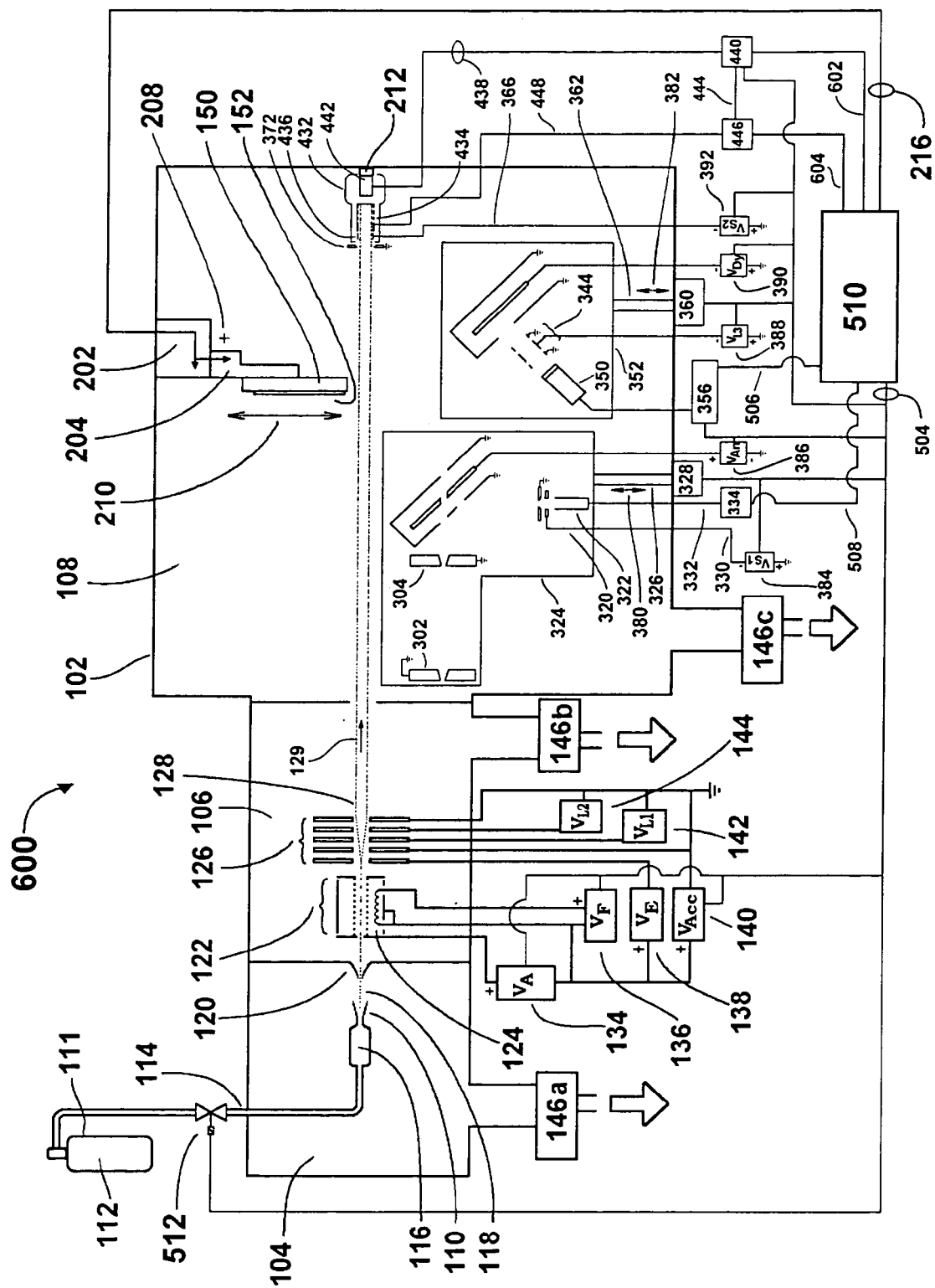
FIG. 11 is a schematic showing the improved GCIB processing apparatus according to the second embodiment of the invention, with the beam measurement apparatus removed from the beam to allow workpiece processing.

FIG. 11 is a schematic showing an improved GCIB measurement and processing apparatus 600 according to a preferred second embodiment of the invention. GCIB measurement and processing apparatus 600 is similar to the prior art mechanically scanning GCIB processing apparatus 200, but having GCIB measurement, monitoring, and control improvements for implementing the second embodiment of the invention. Gas metering valve 113 of the prior art processing system is replaced by electronically controllable gas metering valve 512. The beam current sensor 218 of the prior art system and its electrical lead 214 are replaced by aperture 372, (m/q) sensor 432 and electrical lead 448. Controller 220 of the prior art system is replaced by digital processing and control system 510 having improved capabilities and functions, including but not limited to all the hereinbefore described functionality of controller 220. Digital processing and control system 510 may be, for example, a small general-purpose computer for general control of a GCIB processing system. Digital processing and control system 510 has a control bus 504 for communicating with and controlling other devices and/or subsystems. Anode power supply 134, filament power supply 136, and accelerator power supply 140 are each equipped with remote control capabilities and are controllably connected to the digital processing and control system 510 for control thereby via control bus 504. Electronically controllable gas metering valve 512 is also controllably connected to the digital processing and control system 510 for control thereby via control bus 504. The improved GCIB measurement and processing apparatus 500 additionally incorporates all of the elements of the hereinbefore-described GCIB measurement apparatus 300, except that the previously described electrostatic deflector plate 394, electrical lead 396, and beam gating controller 398 of the GCIB switching subsystem are not used. Also the separate secondary electron suppressor 374, the beam current sensor 376, electrical lead 368 and current measuring system 370 previously described are not used. The (m/q) sensor 432 comprises a perforated faraday cup 434 with a secondary electron suppressor 436 and a pressure sensor 442. An electrical lead 448 connects perforated faraday cup to a conventional current measurement system 446 for electrical current measurement. An electrical cable 438 connects pressure sensor 442 to a (m/q) measurement system 440 for transmitting pressure and temperature signals and sensor power. An electrical lead 444 transmits electrical current measurement signals from current measurement system 446 to the (m/q) measurement system 440. The current measurement system 446 and the (m/q) measurement system 440 are both remotely controllable and able to provide data signals to digital processing and control system 510.

The digital processing and control system 510 communicates with and controls (via control bus 504) at least the following devices: suppressor power supply 384, for switching $V_{S1}$ on or off; mechanical actuators 328 and 360 for commanding positioning of (respectively) analyzer mounting and alignment plate 324 and particle detector mounting and alignment plate 352 with respect to GCIB axis 129; anode power supply 134, for controlling $V_A$; filament power supply 136, for controlling $V_F$; accelerator power supply 140, for controlling $V_{Acc}$; electronically controllable gas metering valve 512, for controlling source gas 112 flow through nozzle 110 and/or source gas pressure in stagnation chamber 116; analyzer power supply 386, for controlling $V_{An}$; optionally, if included, lens power supply 388, for controlling $V_{L3}$; dynode power supply 390, for controlling $V_{Dy}$; suppressor power supply 392, for switching $V_{S2}$ on or off; (m/q) measurement system 440, for controlling pressure sensor power and for commanding (m/q) measurement and transmission; and PMT controller/pulse counter/sampling system 356 for controlling supply voltages for PMT 350 and for enabling or disabling pulse detection by PMT 350 and for controlling transmission of pulse count ($\Gamma$ measurement) information from PMT controller/pulse counter/sampling system 356 to 510 via electrical lead 506. Current measurement system 446 supplies total beam current $I_T$ measurement signals to (m/q) measurement system 440 via electrical lead 444 and also to digital processing and control system 510 via electrical lead 604. (m/q) measurement system 440 provides (m/q) measurement signals to digital processing and control system 510 via electrical lead 602. The digital processing and control system 510 controllably connects to the X-scan actuator 202 and the Y-scan actuator 204 through electrical cable 216 and controls the X-scan actuator 202 and the Y-scan actuator 204 so as to place the workpiece 152 into or out of the path of GCIB axis 129 and can remove the workpiece holder 150 to a position as shown to facilitate GCIB 128 total beam current $I_T$ measurement or to facilitate other GCIB parameter measurements. The digital processing and control system 510 commands the analyzer mounting and alignment plate 324, the particle detector mounting and alignment plate 354, and the workpiece holder 152 into positions analogous to those shown in FIG. 9, and then $$\left(\frac{E}{q}\right)_{average}$$

and $\Gamma$ are measured by the digital processing and control system 510 according to the methods hereinbefore-described. The digital processing and control system 510 commands the analyzer mounting and alignment plate 324, the particle detector mounting and alignment plate 354, and the workpiece holder 152 into positions as shown in FIG. 11 and $I_T$ and (m/q) are measured according to the methods hereinbefore-described. The digital processing and control system 510 calculates $\overline{q}$ according to Eqn. 2, and calculates $\overline{E}$ according to Eqn. 3, and calculates $\overline{m}$ according to Eqn. 4. As shown in FIG. 11, both the analyzer mounting and alignment plate 324 and the particle detector mounting and alignment plate have been retracted from the path of the GCIB 128 by command of the digital processing and control system 510 for workpiece processing by GCIB irradiation.

A workpiece 152, which may be a semiconductor wafer, is held by workpiece holder 150. Workpiece holder is manipulated by the X-scan actuator 202 and the Y-scan actuator 204 under control of the digital processing and control system 510 so as to place the workpiece 152 into or out of the path of GCIB 128 and to scan the workpiece 152 uniformly relative to the GCIB 128 to achieve uniform processing of the workpiece 152 by the GCIB 128. Controller 510 receives the sampled beam current collected by the perforated faraday cup 434 by way of lead 448 and current measuring system 446 and electrical lead 604 and thereby monitors the GCIB 128 total beam current $I_T$ and controls the GCIB dose received by the workpiece 152 by removing the workpiece 152 from the GCIB 128 when a predetermined desired dose has been delivered.

Prior to initiation of processing of a workpiece by GCIB, desired target values or limiting values for any or all of $\bar{E}$, $I_T$, $\bar{m}$ and $\bar{q}$ are chosen and stored within the digital processing and control system 510. For the GCIB parameters for which target or limiting values have been stored, the digital processing and control system 510 measures those GCIB parameters on the GCIB 128 as described hereinbefore. Any GCIB parameters that are measured as not in compliance with the stored limits or targets are adjusted under control of the digital processing and control system 510. $\bar{E}$ is adjusted, for example, by adjusting $V_{Acc}$. $I_T$ is adjusted, for example, by adjusting electronically controllable gas metering valve 512 and/or by adjusting $V_A$ and/or by adjusting $V_F$. $\bar{m}$ is adjusted, for example, by adjusting electronically controllable gas metering valve 512. $\bar{q}$ is adjusted, for example, by adjusting $V_A$ and/or $V_F$. When GCIB parameters, for which desired target values or limiting values have been stored, have all been obtained by automatic adjustment, the digital processing and control system 510 proceeds with the processing of the workpiece 152. The digital processing and control system 510 monitors and, if necessary, adjusts GCIB parameters for which desired target values or limiting values have been stored prior to the processing of each workpiece. If the digital processing and control system 510 is unable, by system adjustments, to achieve the stored beam target or limit values, it halts processing and signals (through display means, not shown) a human operator, thus avoiding mis-processing of the workpiece or workpieces.

Although the invention has been described with respect to measurement of gas cluster ion beams, it is recognized by the inventor that the invention is also applicable to measurement of parameters of cluster ion beams that do not comprise source materials that are gaseous under conditions of standard temperature and pressure and thus is useful in the more general case of measurement of cluster ion beams, including gas cluster ion beams and non-gas cluster ion beams such as, for example, metal cluster ion beams. It is further recognized by the inventor that the invention is useful for measuring parameters of molecular ion beams comprising very heavy molecules. Although the invention has been described with respect to various embodiments, it should be realized this invention is also capable of a wide variety of further and other embodiments within the spirit of the invention.

I claim:

1. Method of determining an average charge state, $\bar{q}$, of cluster ions in a cluster ion beam having a beam path within a reduced-pressure chamber, comprising the steps of:

providing, within the reduced-pressure chamber, a cluster ion beam attenuator, a particle flow rate measurement means, and a cluster ion beam current measurement means;

disposing the cluster ion beam attenuator within the path of said cluster ion beam to form an attenuated sample of the cluster ion beam;

measuring, in turn, the particle flow rate, $\Gamma$, of the attenuated sample of the cluster ion beam and the cluster ion beam current, I, of the attenuated sample of the cluster ion beam; and calculating a measure of the average charge state, $\bar{q}$, of cluster ions in the cluster ion beam by using the equation $$\bar{q} = \frac{\alpha I}{\beta e \Gamma}$$

wherein $\alpha$ and $\beta$ are calibration constants and e is the magnitude of the electronic charge.

2. The method of claim 1, wherein the particle flow rate measurement is performed prior to the cluster ion beam current measurement.

3. The method of claim 1, wherein the particle flow rate measurement is performed after the cluster ion beam current measurement.

4. The method of claim 1, further comprising the step of:
   predetermining the calibration constants $\alpha$ and $\beta$, wherein $\alpha$ is a detection efficiency of the beam current measurement means and $\beta$ is a detection efficiency of the particle flow rate measurement means.

5. The method of claim 1, further comprising the step of:
   removing the cluster ion beam attenuator from the cluster ion beam path.

6. The method of claim 5, further comprising the step of:
   using the determined average charge state, $\bar{q}$, of cluster ions in the cluster ion beam to control the adjustment of cluster ion beam parameters.

7. The method of claim 5, wherein the cluster ion beam is a gas cluster ion beam.

8. Method of determining an average mass, $\bar{m}$, of cluster ions in a cluster ion beam having a beam path within a reduced-pressure chamber, comprising the steps of:

providing, within the reduced-pressure chamber, an average energy per charge measurement means, an average velocity measurement means, a particle flow rate measurement means, and a cluster ion beam current measurement means;

disposing the cluster ion beam attenuator within the path of said cluster ion beam to form an attenuated sample of the cluster ion beam;

measuring, in turn but in any order, the particle flow rate, $\Gamma$, of the attenuated sample of the cluster ion beam, and the cluster ion beam current, I, of the attenuated sample of the cluster ion beam, and the average energy per charge, $$\left(\frac{E}{q}\right)_{average},$$

of the cluster ions in the attenuated sample of the cluster ion beam, and the average velocity, $\bar{v}$, of the cluster ions in the attenuated sample of the cluster ion beam; and calculating a measure of the average mass, $\overline{m}$, of cluster ions in the cluster ion beam by using the equations $$\overline{q} = \frac{\alpha I}{\beta e \Gamma},$$

$$\overline{E} = \overline{q}\left(\frac{E}{q}\right)_{average}, \text{ and}$$

$$\overline{m} = \frac{2\overline{E}}{\overline{v}^2},$$

wherein $\alpha$ and $\beta$ are calibration constants and e is the magnitude of the electronic charge.

9. The method of claim 8, further comprising the step of:
predetermining the calibration constants $\alpha$ and $\beta$, wherein $\alpha$ is a detection efficiency of the beam current measurement means and $\beta$ is a detection efficiency of the particle flow rate measurement means.

10. The method of claim 8, further comprising the step of:
removing the cluster ion beam attenuator from the cluster ion beam path.

11. The method of claim 10, further comprising the step of:
using the determined average mass, $\overline{m}$, of cluster ions in the cluster ion beam to control the adjustment of cluster ion beam parameters.

12. The method of claim 10, wherein the cluster ion beam is a gas cluster ion beam.

13. Method of determining an average energy, $\overline{E}$, of cluster ions in a cluster ion beam having a beam path within a reduced-pressure chamber, comprising the steps of:
providing, within the reduced-pressure chamber, an average energy per charge measurement means, a particle flow rate measurement means, and a cluster ion beam current measurement means;
disposing the cluster ion beam attenuator within the path of said cluster ion beam to form an attenuated sample of the cluster ion beam;
measuring, in turn but in any order, the particle flow rate, $\Gamma$, of the attenuated sample of the cluster ion beam, and the cluster ion beam current, I, of the attenuated sample of the cluster ion beam, and the average energy per charge, $$\left(\frac{E}{q}\right)_{average},$$

of the cluster ions in the attenuated sample of the cluster ion beam; and
calculating a measure of the average energy, $\overline{E}$, of cluster ions in the cluster ion beam by using the equations $$\overline{q} = \frac{\alpha I}{\beta e \Gamma}, \text{ and}$$

$$\overline{E} = \overline{q}\left(\frac{E}{q}\right)_{average},$$

wherein $\alpha$ and $\beta$ are calibration constants and e is the magnitude of the electronic charge.

14. The method of claim 13, further comprising the step of:
predetermining the calibration constants $\alpha$ and $\beta$, wherein $\alpha$ is a detection efficiency of the beam current measurement means and $\beta$ is a detection efficiency of the particle flow rate measurement means.

15. The method of claim 13, further comprising the step of:
removing the cluster ion beam attenuator from within the cluster ion beam path.

16. The method of claim 15, further comprising the step of:
using the determined average energy, $\overline{E}$, of cluster ions in the cluster ion beam to control the adjustment of cluster ion beam parameters.

17. The method of claim 15, wherein the cluster ion beam is a gas cluster ion beam.

18. Method of determining an average mass, $\overline{m}$, of cluster ions in a cluster ion beam having a beam path within a reduced-pressure chamber, comprising the steps of:
providing, within the reduced-pressure chamber, an average energy per charge measurement means, an average mass per charge measurement means, a particle flow rate measurement means, and a cluster ion beam current measurement means;
disposing the cluster ion beam attenuator within the path of said cluster ion beam to form an attenuated sample of the cluster ion beam;
measuring, in turn but in any order, the particle flow rate, $\Gamma$, of the attenuated sample of the cluster ion beam and the cluster ion beam current, I, of the attenuated sample of the cluster ion beam and the average energy per charge, $$\left(\frac{E}{q}\right)_{average},$$

of the cluster ions in the attenuated sample of the cluster ion beam, and the average mass per charge, $$\left(\frac{m}{q}\right)_{average},$$

of the cluster ions in the attenuated sample of the cluster ion beam; and
calculating a measure of the average mass, $\overline{m}$, of cluster ions in the cluster ion beam by using the equations $$\overline{q} = \frac{\alpha I}{\beta e \Gamma}, \text{ and}$$

$$\overline{E} = \overline{q}\left(\frac{E}{q}\right)_{average}, \text{ and}$$

$$\overline{m} = \overline{q}\left(\frac{m}{q}\right)_{average},$$

wherein $\alpha$ and $\beta$ are calibration constants and e is the magnitude of the electronic charge.

19. The method of claim 18, further comprising the step of:
predetermining the calibration constants $\alpha$ and $\beta$, wherein $\alpha$ is a detection efficiency of the beam current measurement means and β is a detection efficiency of the particle flow rate measurement means.

20. The method of claim 18, further comprising the step of:

removing the cluster ion beam attenuator from within the cluster ion beam path.

21. The method of claim 20, further comprising the step of:

using the determined average mass, $\overline{m}$, of cluster ions in the cluster ion beam to control the adjustment of cluster ion beam parameters.

22. The method of claim 20, wherein the cluster ion beam is a gas cluster ion beam.

23. An apparatus utilizing a gas cluster ion beam for processing a surface of a workpiece, the apparatus comprising:

a vacuum vessel;

a gas cluster ion beam source within the vacuum vessel for producing a gas cluster ion beam;

an accelerator for accelerating the gas cluster ion beam along a beam path;

workpiece holding means within the vacuum vessel for holding the workpiece for gas cluster ion beam processing;

first controllable moving means for selectively scanning said workpiece holding means and the workpiece through said accelerated gas cluster ion beam at a location along said beam path and for selectively removing the workpiece holding means and the workpiece from said gas cluster ion beam path;

a cluster ion beam attenuator within said vacuum vessel with second controllable moving means for selectively positioning said attenuator within the gas cluster ion beam path for forming an attenuated sample of the gas cluster ion beam or for positioning said attenuator away from said gas cluster ion beam path for allowing workpiece processing by the un-attenuated gas cluster ion beam;

cluster ion beam current measurement means for measuring a current, I, of said attenuated sample of the gas cluster ion beam;

particle flow rate measurement means for measuring a particle flow rate, Γ, of said attenuated sample of the gas cluster ion beam;

time-of-flight measurement means for measuring an average velocity, $\overline{v}$, of cluster ions in said attenuated sample of the gas cluster ion beam;

spectrometer means for measuring an average energy per charge, $$\left(\frac{E}{q}\right)_{average},$$

of the cluster ions in the attenuated sample of the cluster ion beam;

calculating means for processing measurements of $$\left(\frac{E}{q}\right)_{average},$$

I, Γ, and $\overline{v}$, to calculate a measure of an average mass, $\overline{m}$, of cluster ions in the gas cluster ion beam; and control means for providing signals to said first and second controllable moving means for positioning the attenuator within the gas cluster ion beam path for making average mass, $\overline{m}$, measurement and also for positioning the attenuator away from said gas cluster ion beam path and for scanning the workpiece through said gas cluster ion beam path for workpiece processing.

24. The apparatus of claim 23, wherein the gas cluster ion beam source is a controllable gas cluster ion beam source and wherein the control means uses the measure of the average mass, $\overline{m}$, of clusters in the gas cluster ion beam to control the production of the gas cluster ion beam to improve the workpiece processing.

25. The apparatus of claim 23, wherein the gas cluster ion beam source is a controllable gas cluster ion beam source and wherein the control means uses the measure of the average mass, $\overline{m}$, of clusters in the gas cluster ion beam to adjust the average mass, $\overline{m}$, of clusters in the gas cluster ion beam to a desired value.

26. An apparatus utilizing a gas cluster ion beam for processing a surface of a workpiece, the apparatus comprising:

a vacuum vessel;

a gas cluster ion beam source within the vacuum vessel for producing a gas cluster ion beam;

an accelerator for accelerating the gas cluster ion beam along a beam path;

workpiece holding means within the vacuum vessel for holding the workpiece for gas cluster ion beam processing;

first controllable moving means for selectively scanning said workpiece holding means and the workpiece through said accelerated gas cluster ion beam at a location along said beam path and for selectively removing the workpiece holding means and the workpiece from said gas cluster ion beam path;

a cluster ion beam attenuator within said vacuum vessel with second controllable moving means for selectively positioning said attenuator within the gas cluster ion beam path for forming an attenuated sample of the gas cluster ion beam or for positioning said attenuator away from said gas cluster ion beam path for allowing workpiece processing by the un-attenuated gas cluster ion beam;

cluster ion beam current measurement means for measuring a current, I, of said attenuated sample of the gas cluster ion beam;

particle flow rate measurement means for measuring a particle flow rate, Γ, of said attenuated sample of the gas cluster ion beam;

time-of-flight measurement means for measuring an average velocity, $\overline{v}$, of cluster ions in said attenuated sample of the gas cluster ion beam;

spectrometer means for measuring an average energy per charge, $$\left(\frac{E}{q}\right)_{average},$$

of the cluster ions in the attenuated sample of the cluster ion beam;

calculating means for processing measurements of $$\left(\frac{E}{q}\right)_{average},$$

I, Γ, and $\bar{v}$, to calculate a measure of an average energy, $\bar{E}$, of cluster ions in the gas cluster ion beam; and control means for providing signals to said first and second controllable moving means for positioning the attenuator within the gas cluster ion beam path for making average energy, $\bar{E}$, measurement and also for positioning the attenuator away from said gas cluster ion beam path and for scanning the workpiece through said gas cluster ion beam path for workpiece processing.

27. The apparatus of claim 26, wherein the gas cluster ion beam source is a controllable gas cluster ion beam source and wherein the control means uses the measure of the average energy, $\bar{E}$, of clusters in the gas cluster ion beam to control the production of the gas cluster ion beam to improve the workpiece processing.

28. The apparatus of claim 26, wherein the gas cluster ion beam source is a controllable gas cluster ion beam source and wherein the control means uses the measure of the average energy, $\bar{E}$, of clusters in the gas cluster ion beam to adjust the average energy, $\bar{E}$, of clusters in the gas cluster ion beam to a desired value.

29. An apparatus utilizing a gas cluster ion beam for processing a surface of a workpiece, the apparatus comprising:

a vacuum vessel;

a gas cluster ion beam source within the vacuum vessel for producing a gas cluster ion beam;

an accelerator for accelerating the gas cluster ion beam along a beam path;

workpiece holding means within the vacuum vessel for holding the workpiece for gas cluster ion beam processing;

first controllable moving means for selectively scanning said workpiece holding means and the workpiece through said accelerated gas cluster ion beam at a location along said beam path and for selectively removing the workpiece holding means and the workpiece from said gas cluster ion beam path;

a cluster ion beam attenuator within said vacuum vessel with second controllable moving means for selectively positioning said attenuator within the gas cluster ion beam path for forming an attenuated sample of the gas cluster ion beam or for positioning said attenuator away from said gas cluster ion beam path for allowing workpiece processing by the un-attenuated gas cluster ion beam;

cluster ion beam current measurement means for measuring a current, I, of said attenuated sample of the gas cluster ion beam;

particle flow rate measurement means for measuring a particle flow rate, Γ, of said attenuated sample of the gas cluster ion beam;

average mass per charge measurement means for measuring an average mass per charge, $$\left(\frac{m}{q}\right)_{average},$$

of cluster ions in said attenuated sample of the gas cluster ion beam;

spectrometer means for measuring an average energy per charge, $$\left(\frac{E}{q}\right)_{average},$$

of the cluster ions in the attenuated sample of the cluster ion beam;

calculating means for processing measurements of $$\left(\frac{E}{q}\right)_{average},$$

I, Γ, and $$\left(\frac{m}{q}\right)_{average},$$

to calculate a measure of an average mass, $\bar{m}$, of cluster ions in the gas cluster ion beam; and control means for providing signals to said first and second controllable moving means for positioning the attenuator within the gas cluster ion beam path for making average mass, $\bar{m}$, measurement and also for positioning the attenuator away from said gas cluster ion beam path and for scanning the workpiece through said gas cluster ion beam path for workpiece processing.

30. The apparatus of claim 29, wherein the gas cluster ion beam source is a controllable gas cluster ion beam source and wherein the control means uses the measure of the average mass, $\bar{m}$, of clusters in the gas cluster ion beam to control the production of the gas cluster ion beam to improve the workpiece processing.

31. The apparatus of claim 29, wherein the gas cluster ion beam source is a controllable gas cluster ion beam source and wherein the control means uses the measure of the average mass, $\bar{m}$, of clusters in the gas cluster ion beam to adjust the average mass, $\bar{m}$, of clusters in the gas cluster ion beam to a desired value.

32. An apparatus utilizing a gas cluster ion beam for processing a surface of a workpiece, the apparatus comprising:

a vacuum vessel;

a gas cluster ion beam source within the vacuum vessel for producing a gas cluster ion beam;

an accelerator for accelerating the gas cluster ion beam along a beam path;

workpiece holding means within the vacuum vessel for holding the workpiece for gas cluster ion beam processing;

first controllable moving means for selectively scanning said workpiece holding means and the workpiece through said accelerated gas cluster ion beam at a location along said beam path and for selectively removing the workpiece holding means and the workpiece from said gas cluster ion beam path;

a cluster ion beam attenuator within said vacuum vessel with second controllable moving means for selectively positioning said attenuator within the gas cluster ion beam path for forming an attenuated sample of the gas cluster ion beam or for positioning said attenuator away from said gas cluster ion beam path for allowing workpiece processing by the un-attenuated gas cluster ion beam;

cluster ion beam current measurement means for measuring a current, I, of said attenuated sample of the gas cluster ion beam;

particle flow rate measurement means for measuring a particle flow rate, $\Gamma$, of said attenuated sample of the gas cluster ion beam;

average mass per charge measurement means for measuring an average mass per charge, $$\left(\frac{E}{q}\right)_{average},$$

of cluster ions in said attenuated sample of the gas cluster ion beam;

spectrometer means for measuring an average energy per charge, $$\left(\frac{E}{q}\right)_{average},$$

of the cluster ions in the attenuated sample of the cluster ion beam;

calculating means for processing measurements of $$\left(\frac{E}{q}\right)_{average},$$

I, $\Gamma$, and $$\left(\frac{m}{q}\right)_{average},$$

to calculate a measure of an average energy, $\overline{E}$, of cluster ions in the gas cluster ion beam; and control means for providing signals to said first and second controllable moving means for positioning the attenuator within the gas cluster ion beam path for making average energy, $\overline{E}$, measurement and also for positioning the attenuator away from said gas cluster ion beam path and for scanning the workpiece through said gas cluster ion beam path for workpiece processing.

33. The apparatus of claim 32, wherein the gas cluster ion beam source is a controllable gas cluster ion beam source and wherein the control means uses the measure of the average energy, $\overline{E}$, of clusters in the gas cluster ion beam to control the production of the gas cluster ion beam to improve the workpiece processing.

34. The apparatus of claim 32, wherein the gas cluster ion beam source is a controllable gas cluster ion beam source and wherein the control means uses the measure of the average energy, $\overline{E}$, of clusters in the gas cluster ion beam to adjust the average energy, $\overline{E}$, of clusters in the gas cluster ion beam to a desired value.

* * * * *